United States Patent
Shibata

(10) Patent No.: US 7,471,559 B2
(45) Date of Patent: Dec. 30, 2008

(54) SEMICONDUCTOR MEMORY DEVICE FOR STORING MULTILEVEL DATA

(75) Inventor: Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 88 days.

(21) Appl. No.: 11/693,213

(22) Filed: Mar. 29, 2007

(65) Prior Publication Data

US 2007/0242527 A1    Oct. 18, 2007

(30) Foreign Application Priority Data

Apr. 13, 2006    (JP)    ............................ 2006-111177

(51) Int. Cl.
 *G11C 11/34*    (2006.01)
(52) U.S. Cl. .............................. 365/185.03; 365/185.24
(58) Field of Classification Search ............ 365/185.03, 365/185.24, 185.22, 185.25
See application file for complete search history.

(56) References Cited

U.S. PATENT DOCUMENTS

| | | | |
|---|---|---|---|
| 6,091,631 A * | 7/2000 | Kucera et al. | 365/185.03 |
| 6,657,891 B1 | 12/2003 | Shibata et al. | |
| 6,847,550 B2 * | 1/2005 | Park | 365/185.03 |
| 6,847,555 B2 * | 1/2005 | Toda | 365/185.21 |
| 7,224,614 B1 * | 5/2007 | Chan | 365/185.22 |

FOREIGN PATENT DOCUMENTS

JP    2004-192789    7/2004

* cited by examiner

*Primary Examiner*—Anh Phung
(74) *Attorney, Agent, or Firm*—Oblon, Spivak, McClelland, Maier & Neustadt, P.C.

(57) ABSTRACT

In a memory cell array, a plurality of memory cells are arranged in a matrix. Each of the plurality of memory cells stores one of a plurality of threshold levels. When writing one of the plurality of threshold levels into a first memory cell of the memory cell array, a control circuit writes a threshold level a little lower than the original threshold level. When not writing a second memory cell adjacent to the first memory cell consecutively, the control circuit writes the original threshold level into the first memory cell.

18 Claims, 32 Drawing Sheets

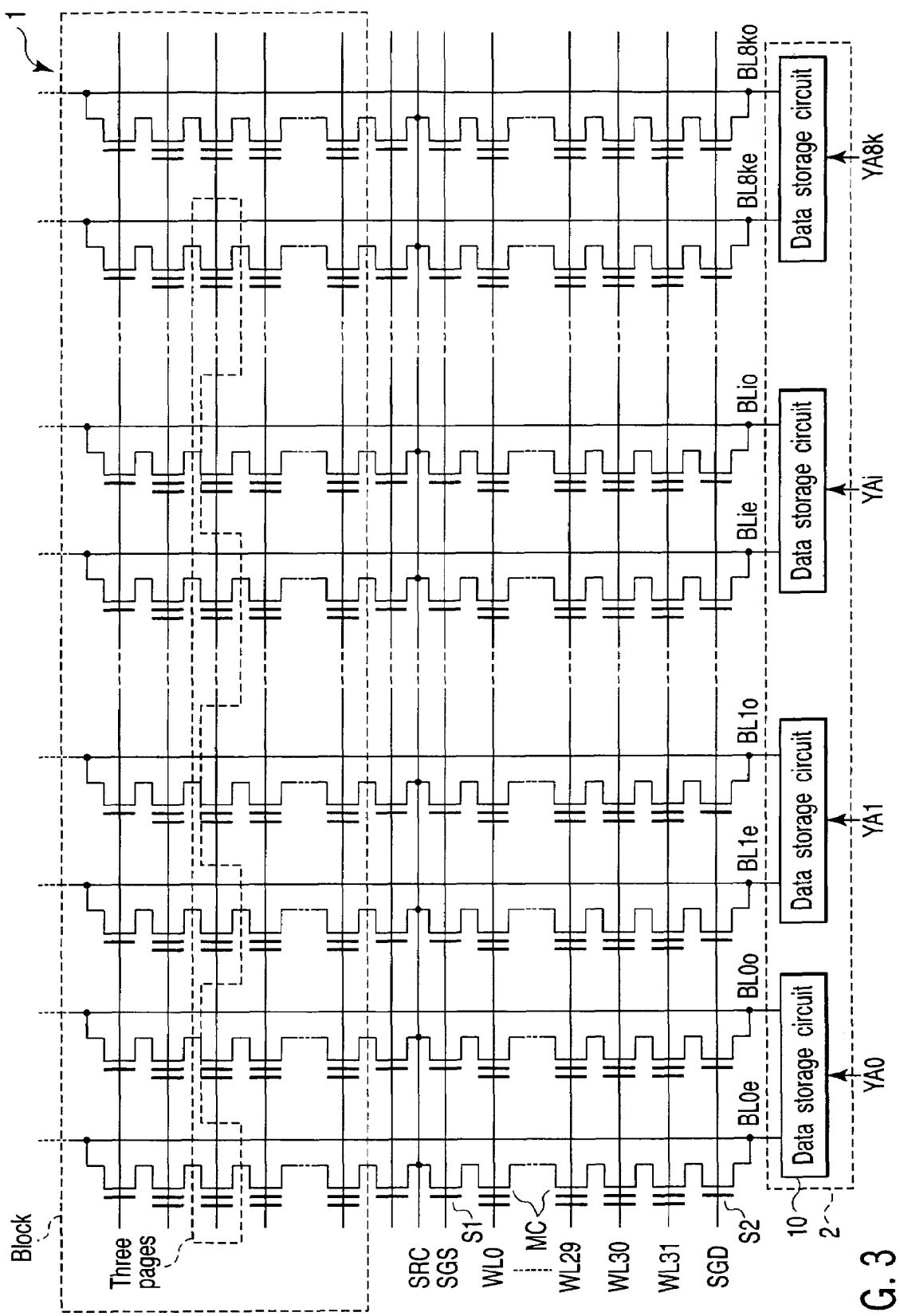
F I G. 3

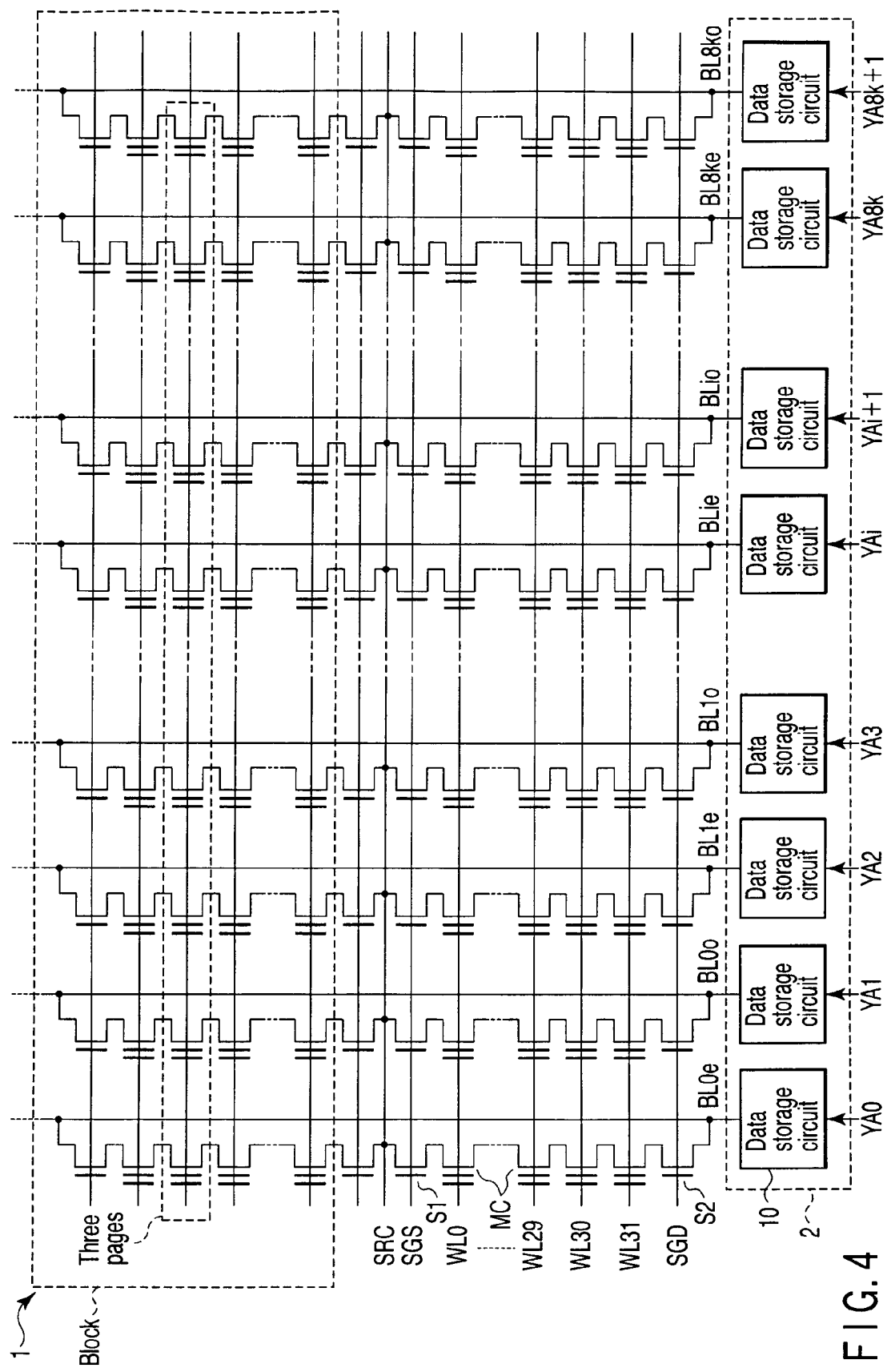
F I G. 4

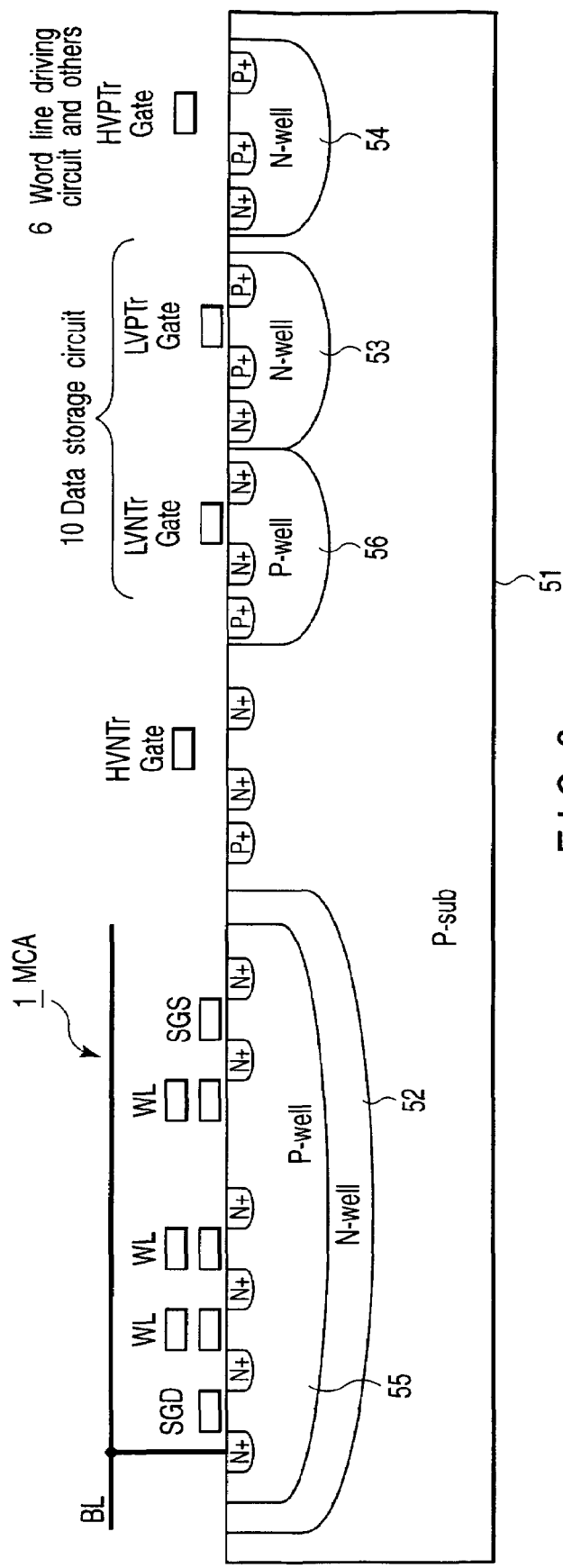
F I G. 6

|  | Cell (P-well) | Cell (N-well) | H.V.Tr (P-sub) | L.V.Nch (P-well) | L.V.Pch (N-well) | H.V.Pch (N-well) |
|---|---|---|---|---|---|---|
| Erase | Vera (20V) | Vera (20V) | Vss (0V) | Vss (0V) | Vdd (2.5V) | Vdd (2.5V) |
| Program | Vss (0V) | Vss (0V) | Vss (0V) | Vss (0V) | Vdd (2.5V) | Vdd (2.5V)/Vpgmh |
| Read | Vss (0V) | Vss (0V) | Vss (0V) | Vss (0V) | Vdd (2.5V) | Vdd (2.5V)/Vreadh |

F I G. 7

| I/O<br>Input cycle | I/O0 | I/O1 | I/O2 | I/O3 | I/O4 | I/O5 | I/O6 | I/O7 |
|---|---|---|---|---|---|---|---|---|
| 1 | A0 | A1 | A2 | A3 | A4 | A5 | A6 | A7 |
| | A0-A11 : Column address | | | | | | | |
| 2 | A8 | A9 | A10 | A11 | A12 | A13 | A14 | A15 |
| | A0-A11 : Column address | | | | Don't Care | | | |
| 3 | A16 | A17 | A18 | A19 | A20 | A21 | A22 | A23 |
| | MLC address | | BL e/o | | W. L. address | | | |
| 4 | A24 | A25 | A26 | A27 | A28 | A29 | A30 | A31 |
| | Block address | | | | | | | |
| 5 | A32 | A33 | A34 | A36 | | | | |
| | Block address | | | P.B. address | | | | |

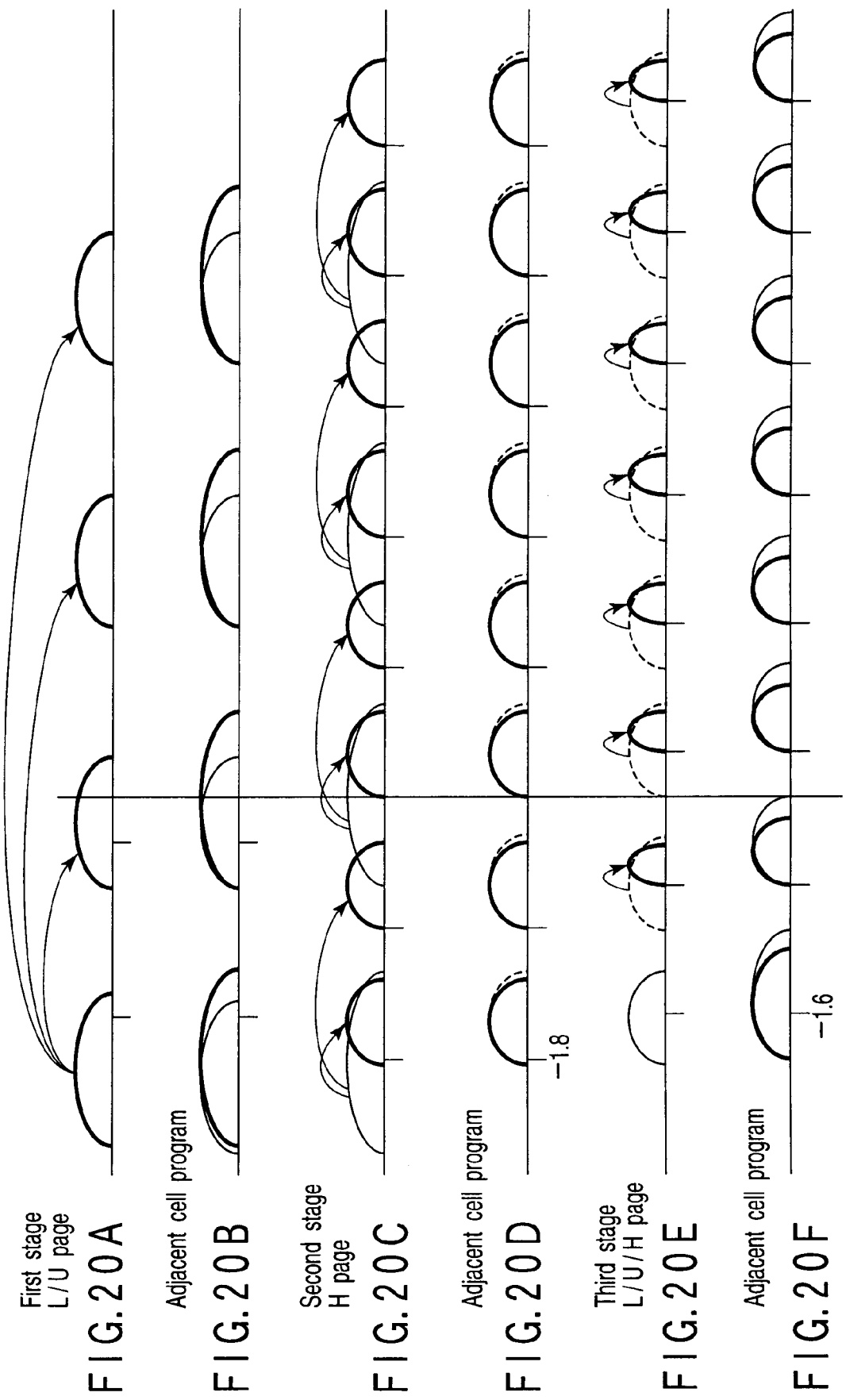

| | | Fig.13, 14, 15 | Fig.18, 19, 20 | Fig.21, 22, 23 |
|---|---|---|---|---|
| FIG. 25A | 80h-Add(LowerPage)-Data-1Ah- 80h-Add(UpperPage)-Data-10h/15h | 4LV | | 1stStage |
| FIG. 25B | 80h-Add(LowerPage)-Data-10h/15h | 2LV | | 1stStage |
| FIG. 25C | 80h-Add(UpperPage)-Data-1Ah- 80h-Add(LowerPage)-Data-10h/15h | 4LV | 1stStage | |
| FIG. 25D | 0Dh-80h-Add(LowerPage)-Data-1Ah- 80h-Add(HigherPage)-Data-10h/15h | 8LV-P | 1stStage | 2ndStage | 2ndStage |
| FIG. 25E | 0Dh-80h-Add(UpperPage)-Data-1Ah- 80h-Add(HigherPage)-Data-1Ah- | 8LV-P with L-internal Load | | | 2ndStage |
| FIG. 25F | 0Dh-80h-Add(HigherPage)-Data-1Ah- | 8LV-P with L/U-internal Load | | 2ndStage | |
| FIG. 25G | 80h-Add(LowerPage)-Data-1Ah- 80h-Add(HigherPage)-Data-10h/15h | 8LV | 2ndStage | 3rdStage | |
| FIG. 25H | 80h-Add(HigherPage)-Data-1Ah- 80h-Add(LowerPage)-Data-10h/15h | 8LV | | | 3rdStage |

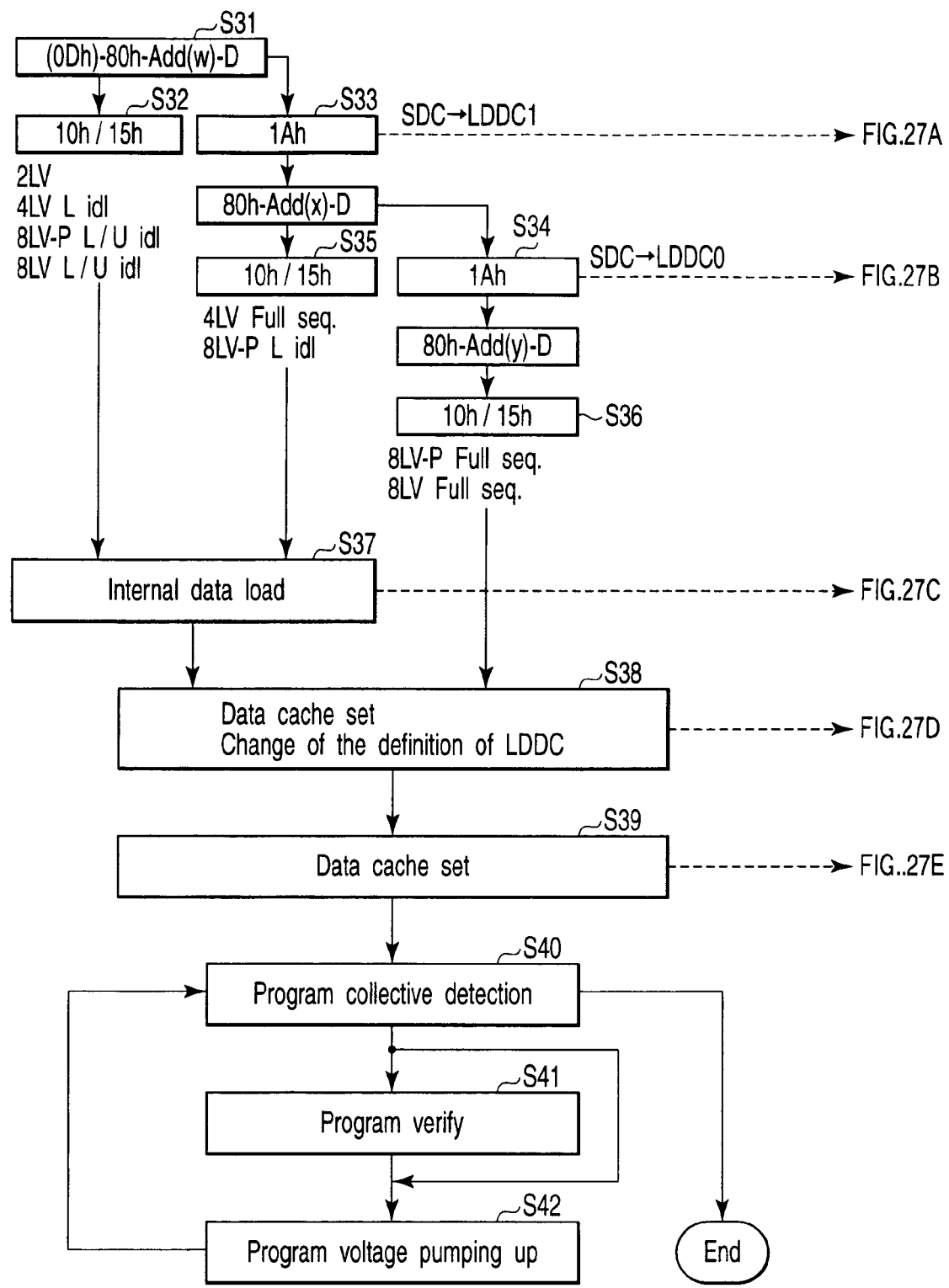
F I G. 26

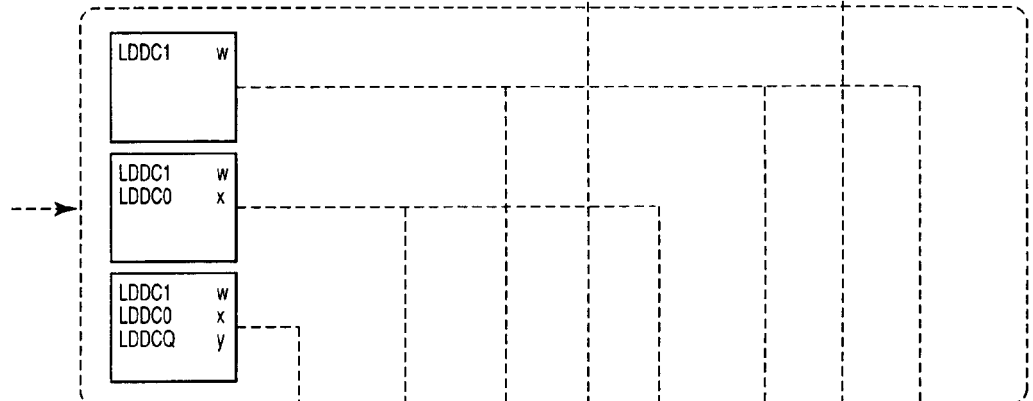
FIG. 27A
FIG. 27B
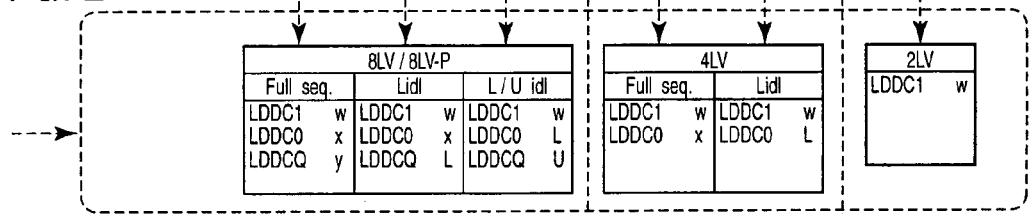
FIG. 27C
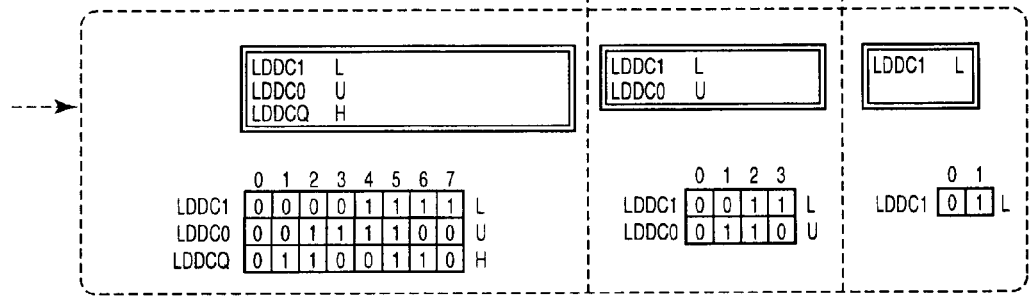
FIG. 27D
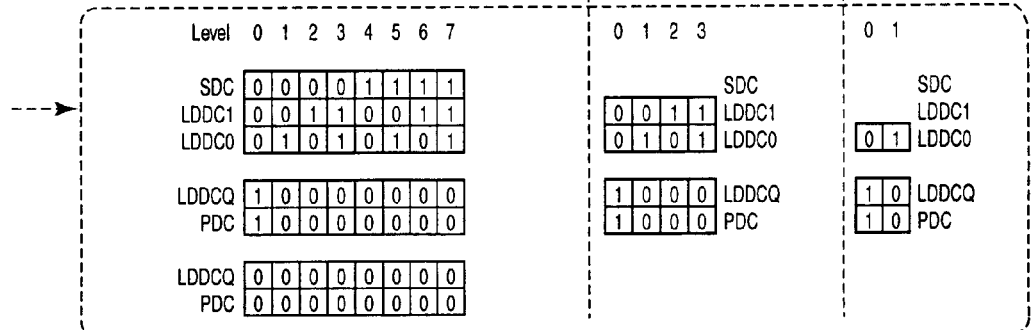
FIG. 27E

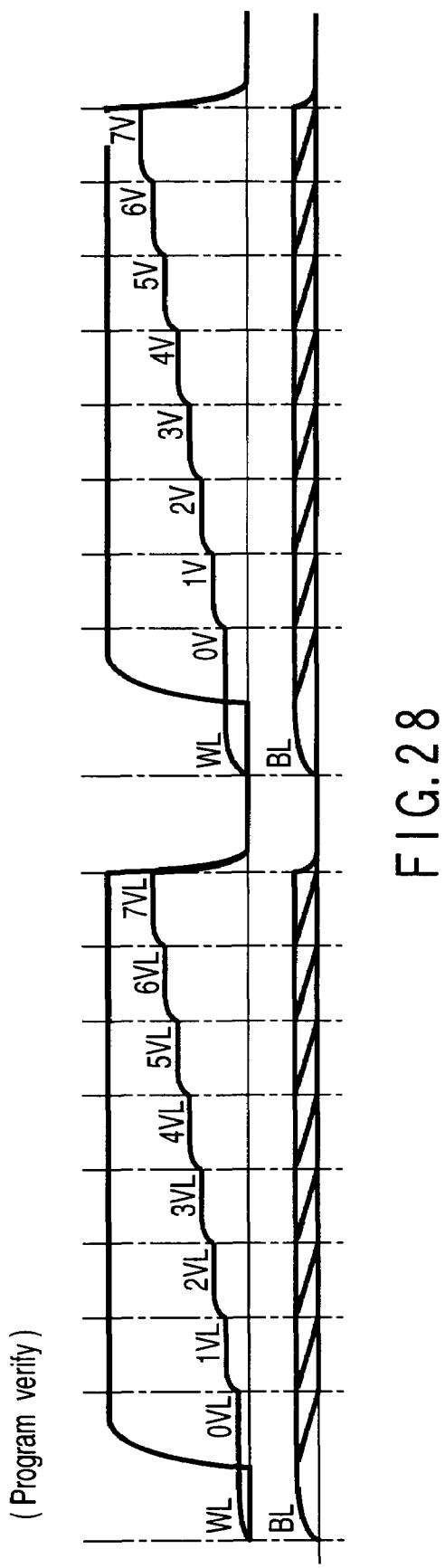
F I G. 28

SEMICONDUCTOR MEMORY DEVICE FOR STORING MULTILEVEL DATA

CROSS-REFERENCE TO RELATED APPLICATIONS

This application is based upon and claims the benefit of priority from prior Japanese Patent Application No. 2006-111177, filed Apr. 13, 2006, the entire contents of which are incorporated herein by reference.

BACKGROUND OF THE INVENTION

1. Field of the Invention

This invention relates to, for example, a NAND flash memory, and more particularly to a semiconductor memory device capable of storing multilevel data in a single memory cell.

2. Description of the Related Art

In a NAND flash memory, all of or half of a plurality of cells arranged in the column direction are connected in series to constitute a NAND cell. The drain side of each NAND cell is connected via a select gate to the corresponding bit line. Each bit line is connected to a write and a read latch circuit. Data is simultaneously written into or read from all of or half of the cells arranged in the row direction. With the recent trend toward larger memory capacity, a memory which stores 2 bits or more of multilevel data into a single cell has been developed (for example, Jpn. Pat. Appln. KOKAI Publication No. 2004-192789).

In a multilevel memory, writing data into an adjacent cell causing a problem: the threshold voltage of the cell in which data has already been written rises as a result of the coupling between the floating gates (FG-FG) of the two cells. Accordingly, the following method has been proposed: for example, in the case of a cell which stores 3 bits using 8 levels, first, 3 bits of data are written to a lower verify level than the original verify level, and then the cells adjacent to this cell are written into. Thereafter, the preceding cell is written into to the original verify level. However, the writing of data into the preceding cell cannot be completed unless data to be written into the adjacent cells (or data in the adjacent cells) has been determined. Therefore, all the cells in the NAND cell have to be written into. Accordingly, a semiconductor memory device capable of suppressing a fluctuation in the threshold level of a cell already written into by writing data into adjacent cells has been desired.

BRIEF SUMMARY OF THE INVENTION

According to a first aspect of the invention, there is provided a semiconductor memory device comprising: a memory cell array in which a plurality of memory cells are arranged in a matrix, each of said plurality of memory cells storing one of a plurality of threshold levels; and a control circuit which, when writing one of said plurality of threshold levels into a first memory cell of the memory cell array, writes a threshold level lower than an original threshold level, and which, when not writing a second memory cell adjacent to the first memory cell consecutively, writes the original threshold level into the first memory cell.

According to a second aspect of the invention, there is provided a semiconductor memory device comprising: a memory cell array in which a plurality of memory cells are arranged in a matrix, each of said plurality of memory cells storing one of a plurality of threshold levels; and a control circuit which, when writing one of said plurality of threshold levels into a first memory cell of the memory cell array and further writing a second memory cell adjacent to the first memory cell consecutively, writes a threshold level lower than an original threshold level and which, when not writing the second memory cell adjacent to the first memory cell consecutively, writes the first memory cell at a decreased write speed.

According to a third aspect of the invention, there is provided a semiconductor memory device comprising: a memory cell array in which a plurality of memory cells are arranged in a matrix, each of said plurality of memory cells storing one of a plurality of threshold levels; and a control circuit which, when writing one of said plurality of threshold levels into a first memory cell of the memory cell array, writes a threshold level lower than an original threshold level and which, when not writing a second memory cell adjacent to the first memory cell consecutively, keeps the first memory cell at the lower threshold level and, when writing one of said plurality of threshold levels into the second memory cell, reads the threshold level from the first memory cell and, after writing a specific threshold level into the second memory cell, writes the original threshold level into the first memory cell on the basis of the result of the reading.

According to a fourth aspect of the invention, there is provided a semiconductor memory device comprising: a plurality of memory cells connected in series each of which stores one of a plurality of threshold levels; a first select gate connected to one end of said plurality of memory cells connected in series; a second select gate connected to the other end of said plurality of memory cells connected in series; and at least one dummy cell connected between at least one of the first and second select gates and a memory cell adjacent to at least one of the first and second select gates.

BRIEF DESCRIPTION OF THE SEVERAL VIEWS OF THE DRAWING

FIG. 3 is a circuit diagram showing a configuration of the memory cell array and bit line control circuit shown in FIG. 2;

FIG. 4 is a circuit diagram showing another configuration of the memory cell array and bit line control circuit shown in FIG. 2;

FIG. 6 is a sectional view of a NAND flash memory;

FIG. 7 is a table listing examples of the voltages supplied to various regions in FIG. 6;

FIGS. 20A to 20F are diagrams to explain the operation of the first modification;

FIGS. 25A to 25H show the relationship between commands and data applied to the first modification;

FIG. 26 shows a write sequence;

FIGS. 27A to 27E show the data in the individual sections corresponding to FIG. 26;

FIG. 28 shows waveforms on a word line and a bit line in a verify sequence;

DETAILED DESCRIPTION OF THE INVENTION

Hereinafter, referring to the accompanying drawings, embodiments of the invention will be explained.

FIRST EMBODIMENT

Figure 2:
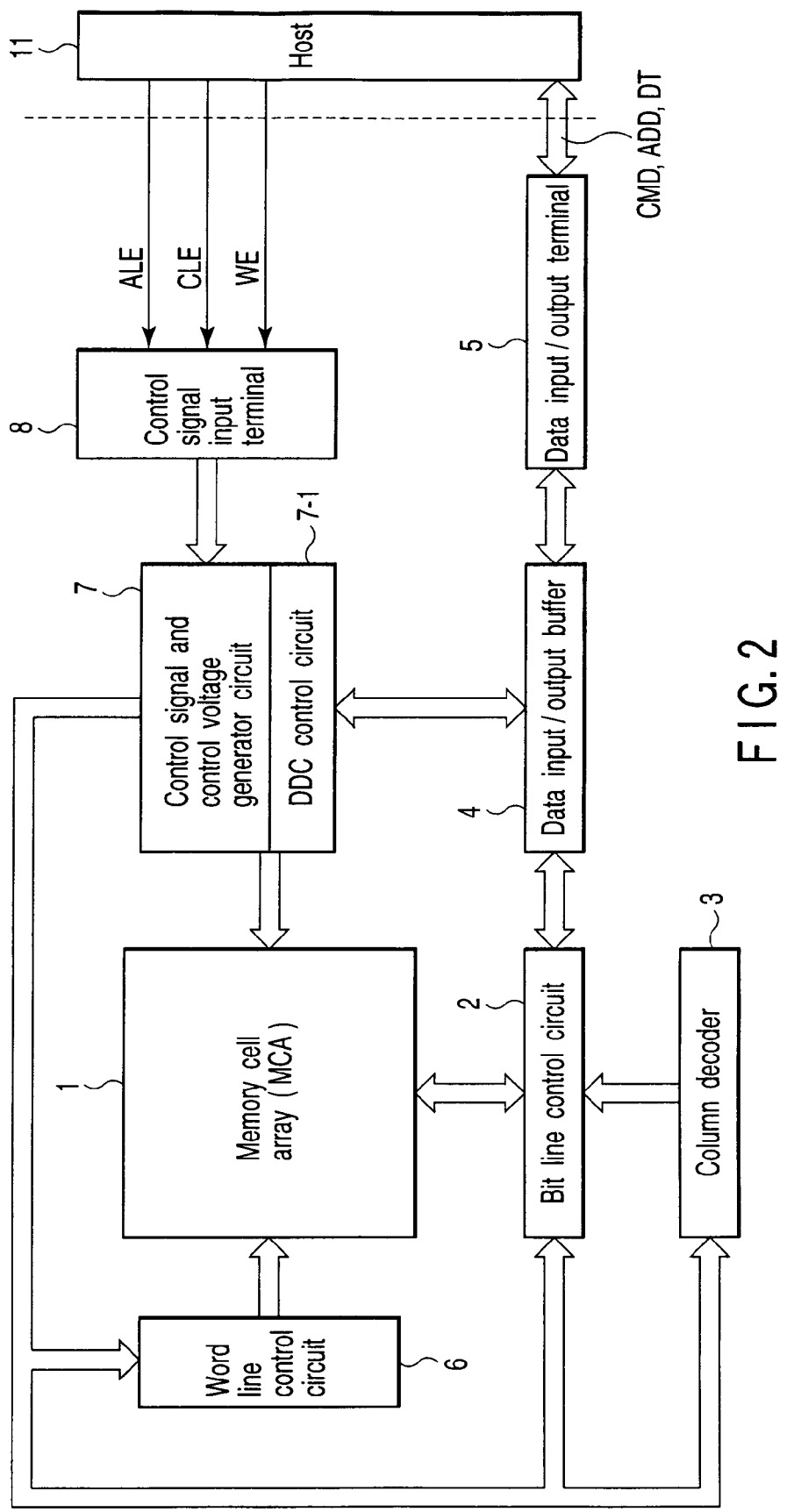
FIG. 2 schematically shows the configuration of a NAND flash memory.

FIG. 2 shows a schematic configuration of a NAND flash memory which stores, for example, 3-bit, 8-level data.

A memory cell array 1 includes a plurality of bit lines, a plurality of word lines, and a common source line. In the memory cell array 1, electrically rewritable memory cells made up of, for example, EEPROM cells are arranged in a matrix. A bit line control circuit 2 for controlling bit lines and a word line control circuit 6 are connected to the memory cell array 1.

The bit line control circuit 2 reads the data in a memory cell of the memory cell array 1 via a bit line, detects the state of a memory cell of the memory cell array 1 via a bit line, and writes data into a memory cell of the memory cell array 1 by applying a write control voltage to the memory cell via a bit line. A column decoder 3 and a data input/output buffer 4 are connected to the bit line control circuit 2. A data storage circuit in the bit line control circuit 2 is selected by the column decoder 3. The data in the memory cell read into the data storage circuit is output via the data input/output buffer 4 at a data input/output terminal 5 to the outside. The data input/output terminal is connected to a host 11 outside the memory chip. The host 11, which is composed of, for example, a microcomputer, receives the data output from the data input/output terminal 5. The host 11 outputs various commands for controlling the operation of the NAND flash memory, addresses ADD, and data DT. The write data input to the input/output terminal 5 from the host 11 is supplied via the data input/output buffer 4 to the data storage circuit selected by the column decoder 3. The commands and addresses are supplied to a control signal and control voltage generator circuit 7.

The word line control circuit 6 is connected to the memory cell array 1. The word line control circuit 6 selects a word line in the memory cell array 1 and applies to the selected word line a voltage necessary for a read, write, or erase operation.

The memory cell array 1, bit line control circuit 2, column decoder 3, data input/output buffer 4, and word line control circuit 6 are connected to and controlled by the control signal and control voltage generator circuit 7. The control signal and control voltage generator circuit 7 is connected to a control signal input terminal 8 and is controlled by control signals ALE (Address Latch Enable), CLE (Command Latch Enable), and WE (Write Enable) input via the control signal input terminal 8 from the host 11.

The bit line control circuit 2, column decoder 3, word line control circuit 6, and control signal and control voltage generator circuit 7 constitute a write circuit and a read circuit.

The control signal and control voltage generator circuit 7 has a dynamic data cache (DDC) control circuit 7-1. The DDC control circuit 7-1 generates a control signal for controlling the refresh operation of a plurality of DRAMs acting as a dynamic latch circuit included in the data storage circuit described later.

FIG. 3 shows a configuration of the memory cell array 1 and bit line control circuit 2 shown in FIG. 2. In the memory cell array 1, a plurality of NAND cells are arranged. A NAND cell is composed of, for example, a memory cell MC made up of, for example, 32 EEPROMs connected in series and select gates S1, S2. Select gate S2 is connected to bit line BL0e and select gate S1 is connected to a source line SRC. The control gates of the memory cells MC arranged in each row are connected equally to word lines WL0 to WL29, WL30, WL31. Select gates S2 are connected equally to select line SGD. Select gates S1 are connected equally to select line SGS.

The bit line control circuit 2 has a plurality of data storage circuits 10. Pairs of bit lines (BL0e, BL0o), (BL1e, BL1o), ..., (BLie, BLio), (BL8ke, BL8ko) are connected to the individual data storage circuits 10.

The memory cell array 1 includes a plurality of blocks as shown by a broken line. Each block is composed of a plurality of NAND cells. In the memory cell array 1, data is erased in, for example, blocks. In addition, an erase operation is carried out simultaneously on the two bit lines connected to the data storage circuit 10.

A plurality of memory cells (or the memory cells enclosed by a broken line) arranged for every other bit line and connected to a single word line constitute one sector constitute a sector. Data is written or read in sectors. Specifically, half of the memory cells arranged in the row direction are connected to the corresponding bit line. Therefore, data is simultaneously written into or read from half of the memory cells arranged in the row direction.

In a read operation, a program verify operation, and a program operation, one of the two bit lines (BLie, BLio) connected to the data storage circuit 10 is selected according to the address signal (YA0, YA1, ..., YAi, ..., YA8k) supplied from the outside. Furthermore, one word line is selected according to an external address and a third page indicated by a broken line is selected. The changing of the third page is done using an address.

FIG. 4 shows another configuration of the memory cell array 1 and bit line control circuit 2 shown in FIG. 2. In the configuration of FIG. 3, two bit lines (BLie, BLio) are connected to the data storage circuit 10. In contrast, with the configuration of FIG. 4, a data storage circuit 10 is connected to each bit line. The memory cells arranged in the row direction are all connected to the corresponding bit line. Consequently, data can be written into or read from all the memory cells arranged in the row direction.

Although the configuration of FIG. 3 and that of FIG. 4 can be used, explanation will be given using FIG. 3.

Figure 5A:
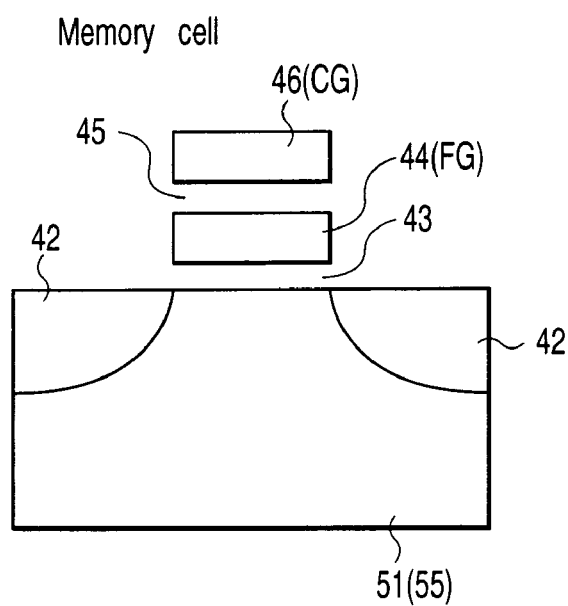
FIGS. 5A and 5B are sectional views of a memory cell and a select transistor, respectively.
Figure 5B:
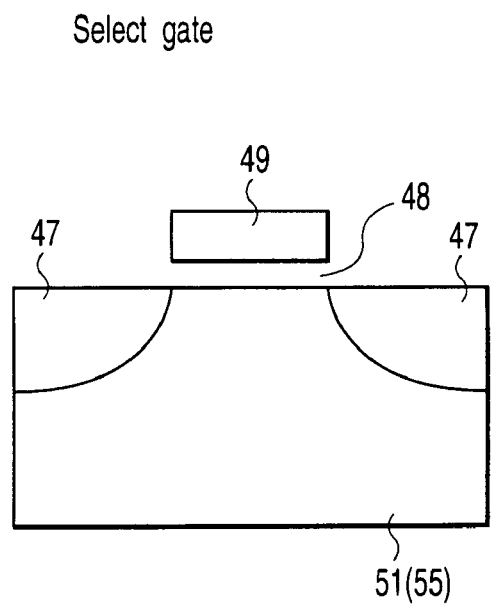

FIGS. 5A and 5B show a sectional view of a memory cell and that of a select transistor, respectively. FIG. 5A shows a memory cell. In a substrate 51 (or a p-well region 55 described later), an n-type diffused layer 42 acting as the source and drain of a memory cell is formed. Above the p-well region 55, a floating gate (FG) 44 is formed via a gate insulating film 43. Above the floating gate 44, a control gate (CG) 46 is formed via an insulating film 45. FIG. 5B shows a select gate. In the p-well region 55, an n-type diffused layer 47 acting as a source and a drain is formed. Above the p-well well region 55, a control gate 49 is formed via a gate insulating film 48.

FIG. 6 is a sectional view of a NAND flash memory. For example, in a p-type semiconductor substrate 51, n-well regions 52, 53, 54 and a p-well region 56 are formed. In the n-well region 52, the p-well region 55 is formed. In the p-well region 55, low-voltage n-channel transistors LVNTr constituting the memory cell array 1 are formed. In the n-well region 53 and p-well region 56, a low-voltage p-channel transistor LVPTr and a low-voltage n-channel transistor LVNTr constituting a data storage circuit 10 are formed respectively. In the substrate 51, a high-voltage n-channel transistor HVNTr connecting a bit line and the data storage circuit 10 is formed. In the n-well region 54, a high-voltage p-channel transistor HVPTr constituting, for example, a word-line driving circuit or the like is formed. As shown in FIG. 6, the high-voltage transistors HVNTr, HVPTr have, for example, a thicker gate insulating film than that of the low-voltage transistors LVNTr, LVPTr.

FIG. 7 shows an example of voltages supplied to various regions shown in FIG. 6. In an erase operation, a program operation, and a read operation, the voltages as shown in FIG. 7 are supplied to various regions. Vera is a voltage applied to the substrate in erasing data. Vss is the ground voltage. Vdd is a power supply voltage. Vpgmh is a voltage Vpgm+Vth supplied to a word line in writing data. Vreadh is a voltage Vread+Vth supplied to a word line in reading data.

Figure 8:
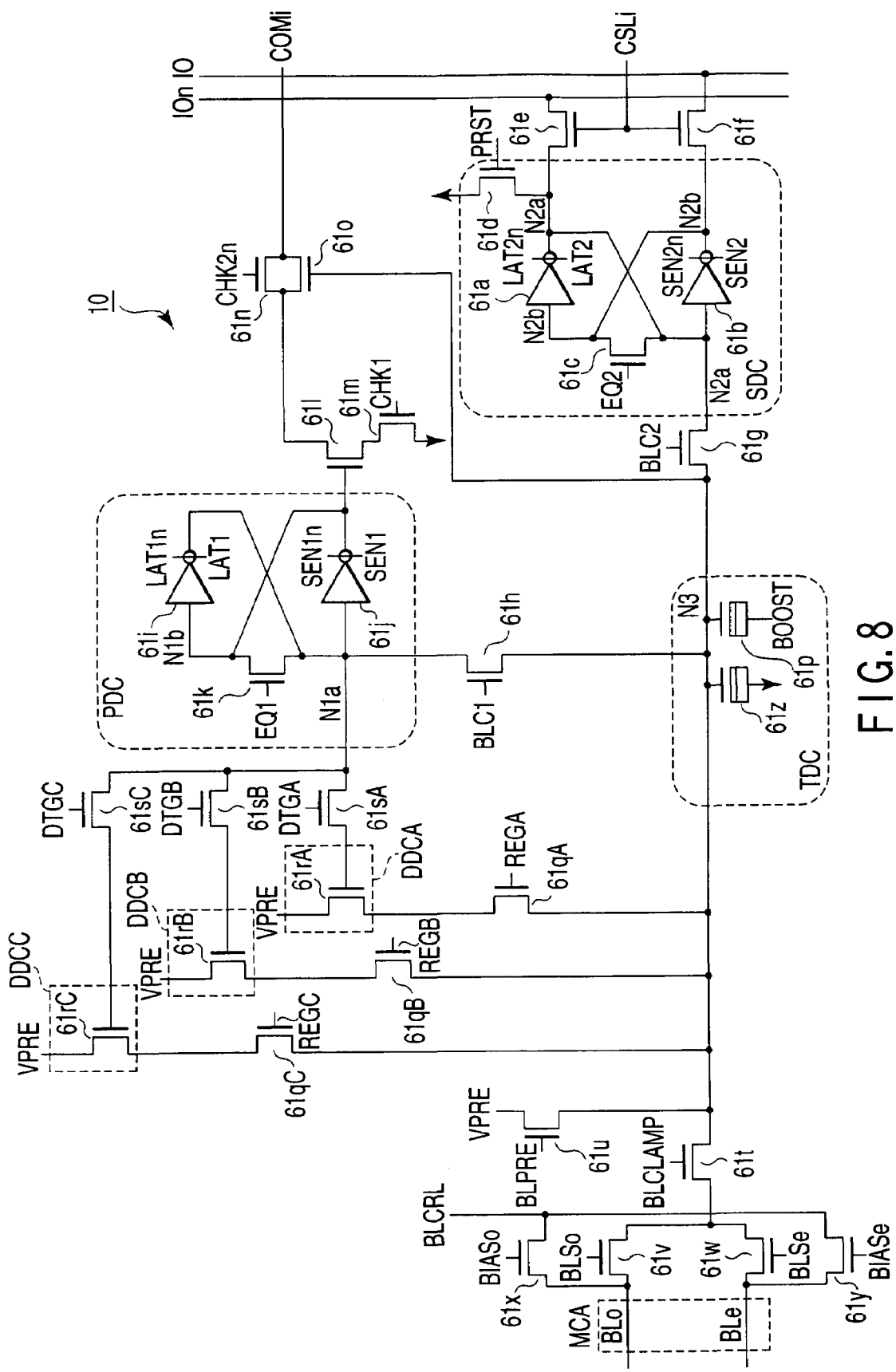
FIG. 8 is a circuit diagram of the data storage circuit shown in FIG. 3.

FIG. 8 is a circuit diagram of the data storage circuit 10 shown in FIG. 3.

FIG. 8 shows a case where, for example, 3-bit, 8-level data is written and read. The data storage circuit 10 includes a primary data cache (PDC), a secondary data cache (SDC), dynamic data caches (DDCA, DDCB, DDCC), and a temporary data cache (TDC). The SDC, PDC, DDCA, DDCB, and DDCC hold the input data in a write operation, hold the read-out data in a read operation, hold the data temporarily in a verify operation, and are used for the manipulation of internal data in storing multilevel data. The TDC amplifies the data on a bit line and holds the data temporarily in a data read operation, and is used for the manipulation of internal data in storing multilevel data.

The SDC is composed of clocked inverter circuits 61a, 61b constituting a static latch circuit and transistors 61c, 61d. The transistor 61c is connected between the input end of the clocked inverter circuit 61a and the input end of the clocked inverter circuit 61b. A signal EQ2 is supplied to the gate of the transistor 61c. The transistor 61d is connected between the output end of the clocked inverter circuit 61a and the ground. A signal PRST is supplied to the gate of the transistor 61d. Node N2a of the SDC is connected via a column select transistor 61e to an input/output data line IOn. Node N2b of the SDC is connected via a column select transistor 61f to an input/output data line IO. A column select signal CSLi is supplied to the gates of the transistors 61e, 61f. Node N2a of the SDC is connected to node N1a of the PDC via transistors 61g, 61h. A signal BLC2 is supplied to the gate of the transistor 61g. A signal BLC1 is supplied to the gate of the transistor 61h.

The PDC is composed of clocked inverter circuits 61i, 61j constituting a static latch circuit and a transistor 61k. The transistor 61k is connected between the input end of the clocked inverter circuit 61i and the input end of the clocked inverter circuit 61j. A signal EQ1 is supplied to the gate of the transistor 61k. Node N1b of the PDC is connected to the gate of the transistor 61l. One end of the current path of the transistor 61l is connected to the ground via a transistor 61m. A signal CHK1 is supplied to the gate of the transistor 61m. The other end of the current path of the transistor 61l is connected to one end of the current path of transistors 61n, 61o constituting a transfer gate. A signal CHK2n is supplied to the gate of the transistor 61n. The gate of the transistor 61o is connected to node N3. The other end of the current path of the transistors 61n, 61o is connected to a signal line COMi. The signal line COMi is connected equally to all of the data storage circuits 10. On the basis of the level of the signal line COMi, whether all of the data storage circuits 10 have been verified can be determined. Specifically, as described later, if the verification has been completed, node N1b of the PDC goes low (or node N1a goes high). In this state, when the signals CHK1, CHK2n are made high, if the verification has been completed, the signal line COMi goes high.

Furthermore, the TDC is composed of, for example, a MOS capacitor 61p. One end of the capacitor 61p is connected to a junction node N3 of the transistors 61g, 61h. A signal BOOST described later is supplied to the other end of the capacitor 61p. The DDCA, DDCB, and DDCC are connected to the junction node N3 via transistors 61qA to 61qC. Signals REGA to REGC are supplied to the gates of the transistors 61qA to 61qC.

The DDCA, DDCB, and DDCC constituting a dynamic latch circuit are composed of transistors 61rA to 61rC, respectively. Signal VPRE is supplied to one end of the current path of each of the transistors 61rA to 61rC. The other ends of the transistors 61rA to 61rC are connected to the current paths of the transistors 61qA to 61qC, respectively. The gates of the transistors 61rA to 61rC are connected to node N1a of the PDC via transistors 61sA to 61sC. Signals DTGA to DTGC are supplied to the gates of the transistors 61sA to 61sC, respectively.

Furthermore, one end of the current path of each of transistors 61t, 61u is connected to the junction node N3. A signal VPRE is supplied to the other end of the current path of the transistor 61u. A signal BLPRE is supplied to the gate of the transistor 61u. A signal BLCLAMP is supplied to the gate of the transistor 61t. The other end of the current path of the transistor 61t is connected to one end of bit line BLo via a transistor 61v and to one end of bit line BLe via a transistor 61w. One end of bit line BLo is connected to one end of the current path of a transistor 61x. A signal BIASO is supplied to the gate of the transistor 61x. One end of bit line BLe is connected to one end of the current path of a transistor 61y. A signal BIASe is supplied to the gate of the transistor 61y. A signal BLCRL is supplied to the other ends of the current paths of these transistors 61x, 61y. The transistors 61x, 61y are turned on according to signals BIASo, BIASe so as to be complementary to the transistors 61v, 61w, thereby supplying the potential of the signal BLCRL to the unselected bit lines.

Between node N3 and the ground, for example, a MOS capacitor 61z is connected. The capacitor 61z adjusts the potential at node N3 so as to prevent the potential at node N3 from rising too much by coupling in raising the voltage of the capacitor 61p of the TDC described later by the signal BOOST. Hereinafter, suppose data in the PDC is the potential at node N1a, data in the SDC is the potential at node N2a, data in the TDC is the potential at node N3, and data in the DDCA to DDCC are the potentials of the gates of the transistors 61rA to 61rC.

The individual signals and voltages are generated by the control signal and control voltage generator circuit 7 shown in FIG. 2. Under the control of the control signal and control voltage generator circuit 7, a data write operation, a verify operation, and a read operation are controlled. Moreover, the DDCA to DDCC are refreshed by the control signal generated by the DDC control circuit 7-1.

The memory stores, 3 bits of data in a single cell using 8 threshold voltages. The switching between the 3 bits is controlled using addresses (or a first page, a second page, and a third page).

Figures 9, 10:
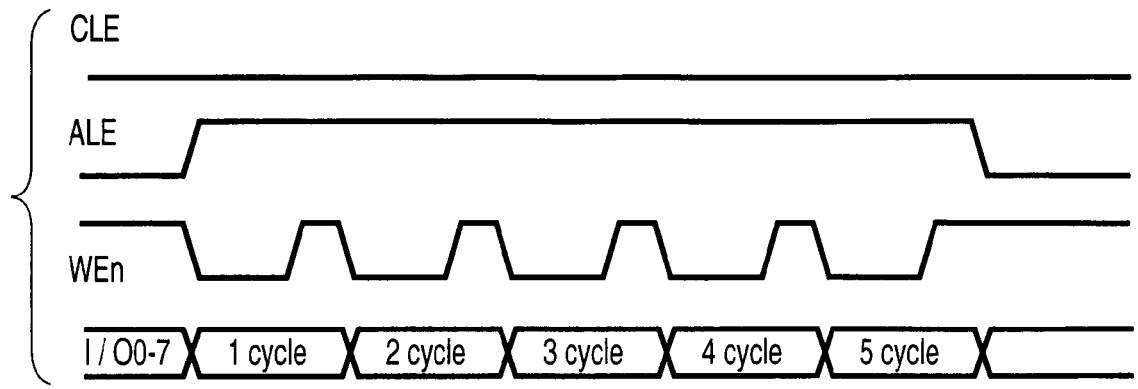
FIG. 9 is a timing chart to explain an address input cycle.
FIG. 10 shows input cycles and address allocation.

FIG. 9 is a timing chart to explain an address input cycle. When a command latch enable signal CLE is set at the low level (also referred to as the L level or L) and an address latch enable signal ALE is set at the high level (also referred to as the H level or H) in FIG. 9. In this state, when a write enable signal WEn is changed from the low level to the high level, I/O 0 to I/O 7 externally input are read as an address.

FIG. 10 shows input cycles and the allocation of addresses. As shown in FIG. 10, a first and a second cycle are for a column address. I/O 0 to I/O 1 (A16, A17) in a third cycle are for an MLC (Multi Level Cell) address for changing page addresses as follows: when (A16, A17)=(L, L), a lower page appears; when (A16, A17)=(H, L), an upper page appears; and when (A16, A17)=(L, H), a higher page appears. I/O 3 (A18) in the third cycle is for selecting one of the two bit lines (BLie, BLio). I/O 3 to I/O 7 (A19 to A23) in the third cycle are for selecting one of the 32 word lines in a NAND cell. A fourth and a fifth cycle are for a block address.

Figure 11:
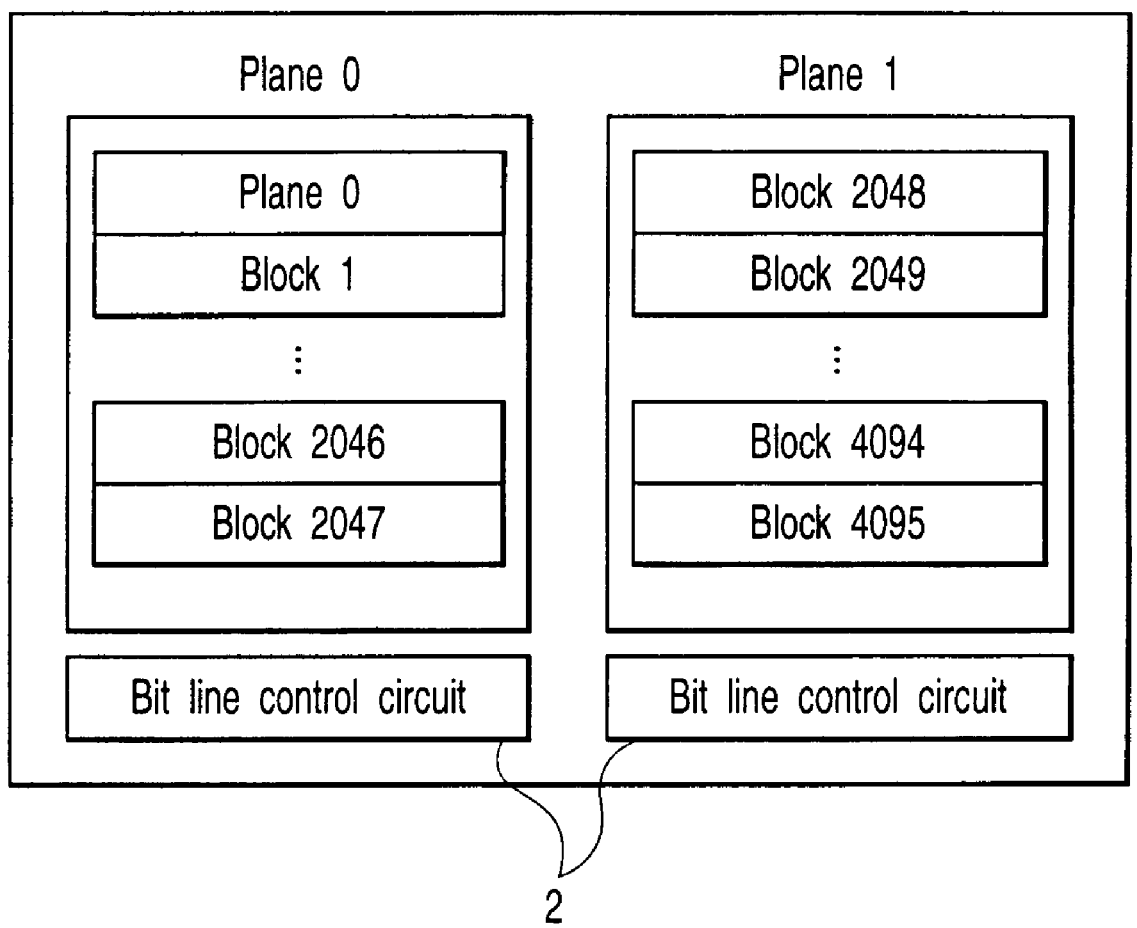
FIG. 11 shows the relationship between the planes and blocks in the memory cell array.

FIG. 11 shows the relationship between the memory cell array (plane 0, plane 1) and a block. As shown in FIG. 11, the NAND flash memory has two planes 0, 1. Each of the planes 0, 1 includes, for example, the memory cell array 1, bit line control circuit 2, column decoder 3, and word line control circuit 6 shown in FIG. 2. The control signal and control voltage generator circuit 7, control input terminal 8, data input/output buffer 4, and data input/output terminal 5 are shared by the individual planes. In FIG. 11, only the bit line control circuit 2 is shown.

In plane 0, blocks 0 to 2047 are arranged. In plane 1, blocks 2048 to 4095 are arranged. Since a plurality of blocks are arranged in each of plane 1 and plane 0 in this way, either plane is selected by I/O 3 (A36) in the fifth cycle. Moreover, a read operation, a program operation, or an erase operation can be carried out by selecting an arbitrary block in each plane, a total of two blocks, at the same time.

Figure 12:
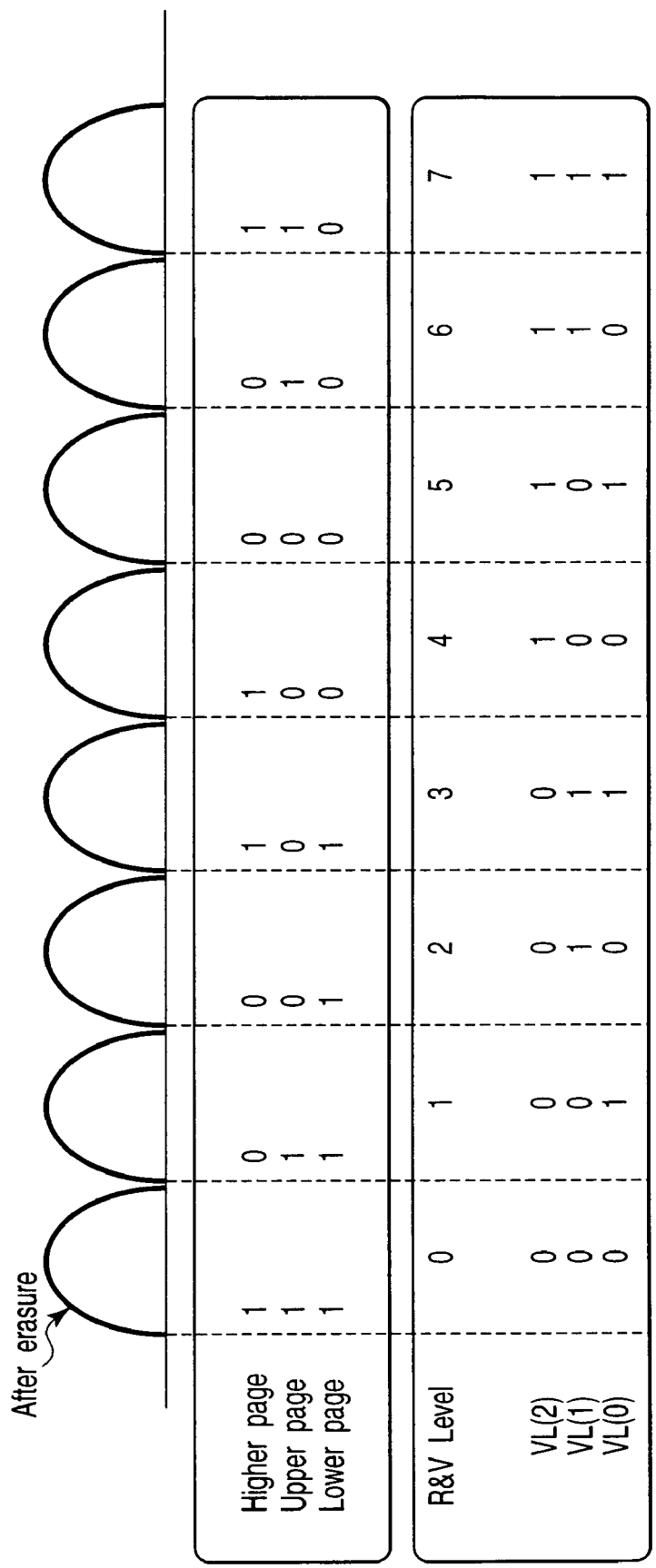
FIG. 12 shows the relationship between data in a memory cell and the threshold voltage distribution in the memory cell.

FIG. 12 shows the relationship between data in a memory cell and the threshold voltage distribution in the memory cell. After an erase operation is carried out, the data in the memory cell is at the leftmost threshold voltage. As a result of a write operation, 3 bits of data (8-level data) are stored in a single cell, producing eight threshold distributions.

With the above configuration, an operation will be explained.

(Program and Program Verify)
(Program Sequence)

Figure 13:
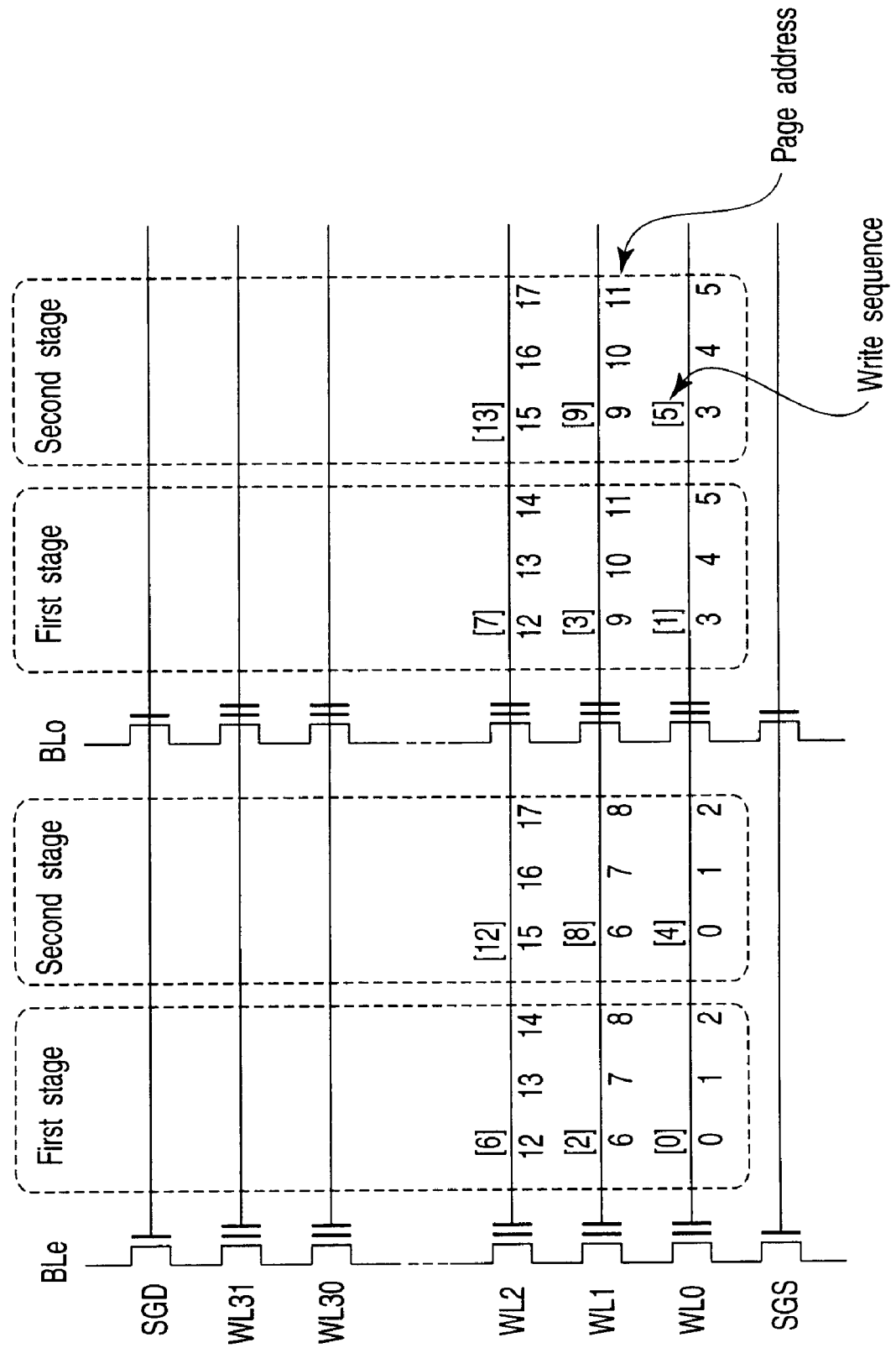
FIG. 13 shows the sequence in which a NAND cell is written into.

FIG. 13 shows the order in which data is written into a NAND cell. A write operation is carried out page by page in a block, starting from the memory cell close to the source line. FIGS. 14A to 14F show the transition of the threshold voltage of the memory cell in each write operation. As shown in FIG. 13 and FIGS. 14A to 14F, as a result of a first and a second stage write operation, or two write operations, 3 bits of data (8-level data) are written into a single cell.

First, in a 0-th write operation [0], 3 bits of data (7-level data) on a lower page, an upper page, and a higher page (page addresses: 0, 1, 2) are written into the cell with word line WL0 and bit line BLe by a first stage write operation. As a result, the threshold voltage distribution is as shown in FIG. 14A.

Next, in a first write operation [1], 3 bits of data (7-level data) on the lower page, the upper page, and the higher page (page addresses: 3, 4, 5) are written into the cell with word line WL0 and bit line BLo by the first stage write operation.

Next, in a second write operation [2], 3 bits of data (7-level data) on the lower page, the upper page, and the higher page (page addresses: 6, 7, 8) are written into the cell with word line WL1 and bit line BLe by the first stage write operation.

Next, in a third write operation [3], 3 bits of data (7-level data) on the lower page, the upper page, and the higher page (page addresses: 9, 10, 11) are written into the cell with word line WL1 and bit line BLo by the first stage write operation.

As a result, for example, the distribution of threshold voltages of the cell with word line WL0 and bit line BLe expands as shown by the dotted lines in FIG. 14B because of changes in the threshold voltages of the adjacent cells.

Next, in a fourth write operation [4], 3 bits of data (8-level data) on the lower page, the upper page, and the higher page (page addresses: 0, 1, 2) are written into the cell with word line WL0 and bit line BLo by the second stage write operation. As a result, the threshold voltage distribution is as shown by solid lines in FIG. 14C.

Next, in a fifth write operation [5], 3 bits of data (8-level data) on the lower page, the upper page, and the higher page (page addresses: 3, 4, 5) are written into the cell with word line WL0 and bit line BLo by the second stage write operation.

Next, in a sixth write operation [6], 3 bits of data (7-level data) on the lower page, the upper page, and the higher page (page addresses: 12, 13, 14) are written into the cell with word line WL2 and bit line BLe by the first stage write operation.

Next, in a seventh write operation [7], 3 bits of data (7-level data) on the lower page, the upper page, and the higher page (page addresses: 12, 13, 14) are written into the cell with word line WL2 and bit line BLo by the first stage write operation.

Next, in an eighth write operation [8], 3 bits of data (8-level data) on the lower page, the upper page, and the higher page (page addresses: 6, 7, 8) are written into the cell with word line WL1 and bit line BLe by the second stage write operation.

Next, in a ninth write operation [9], 3 bits of data (8-level data) on the lower page, the upper page, and the higher page (page addresses: 9, 10, 11) are written into the cell with word line WL1 and bit line BLo by the second stage write operation.

As a result, for example, the distribution of threshold voltages of the cell with word line WL0 and bit line BLe expands as shown by the broken lines in FIG. 14D because of changes in the threshold voltages of the adjacent cells.

Figure 14:
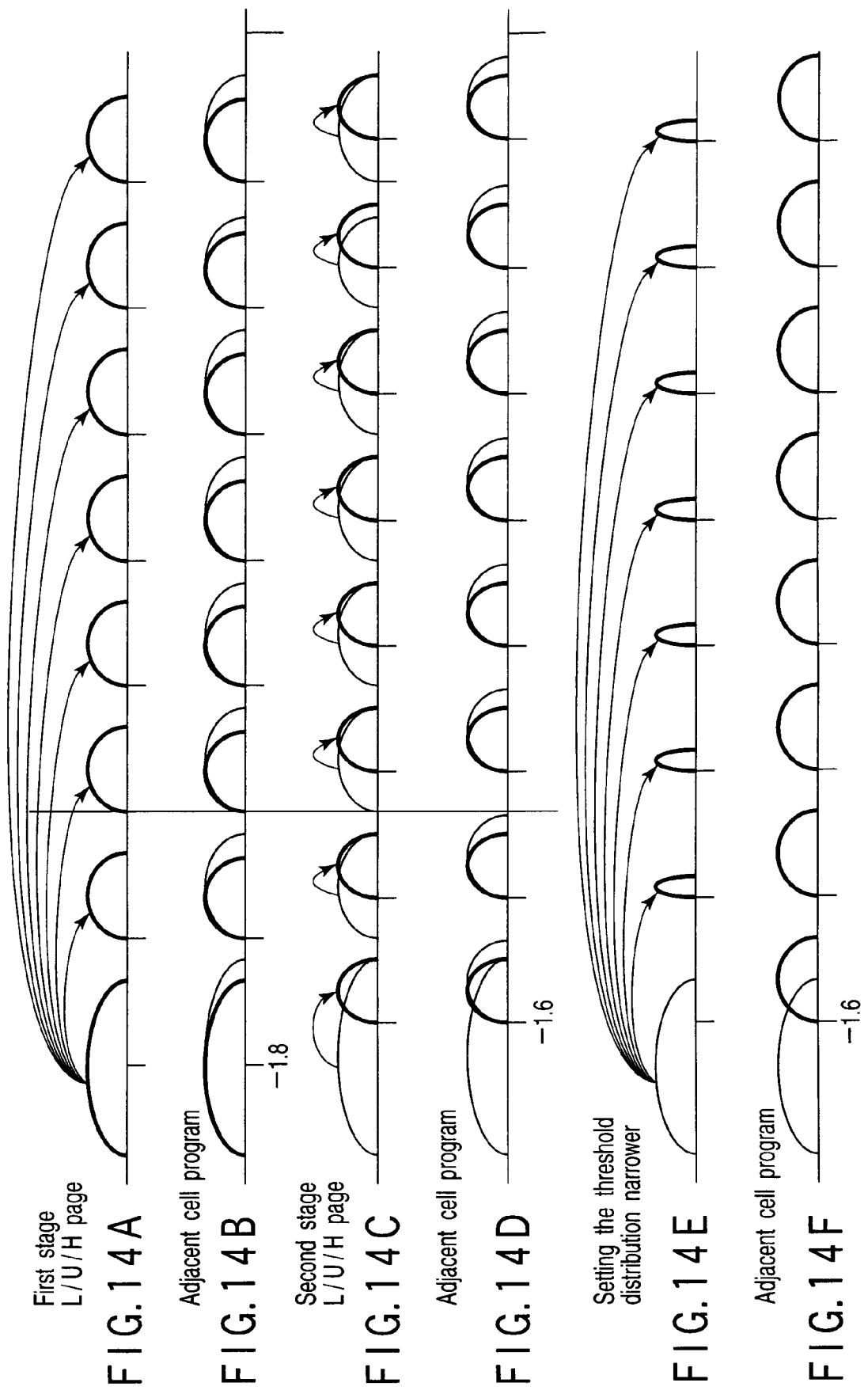
FIGS. 14A to 14F show the transition of the threshold voltage each time writing is done.
Figure 15:
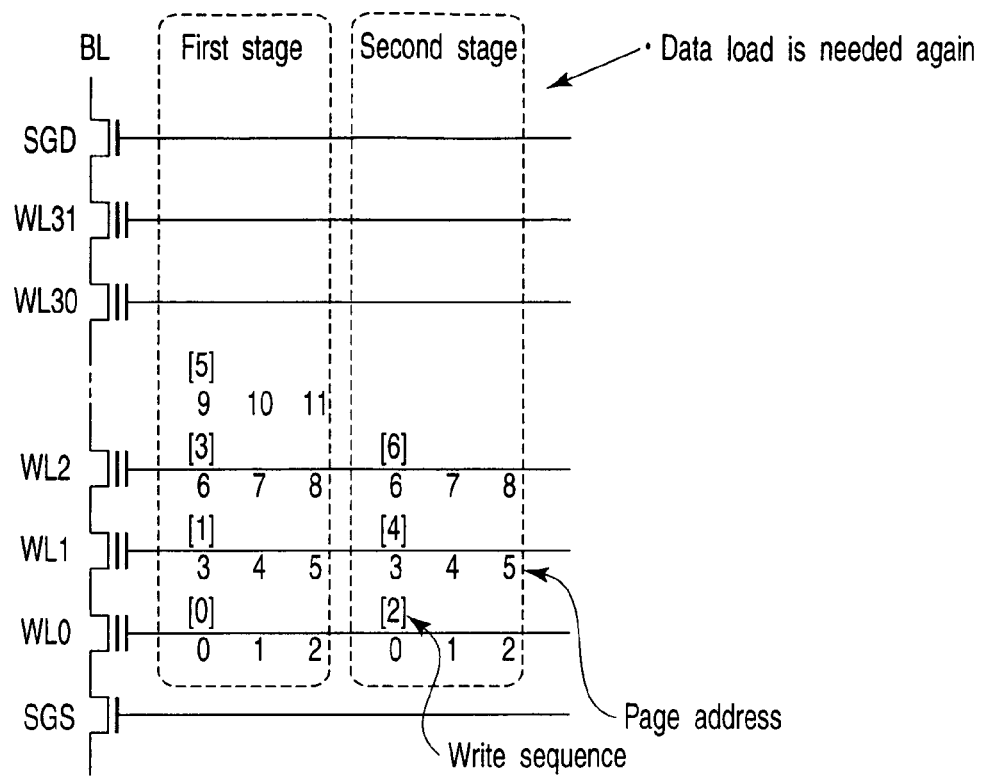
FIG. 15 shows the way one NAND cell of FIG. 4 is written into.
Figure 19:
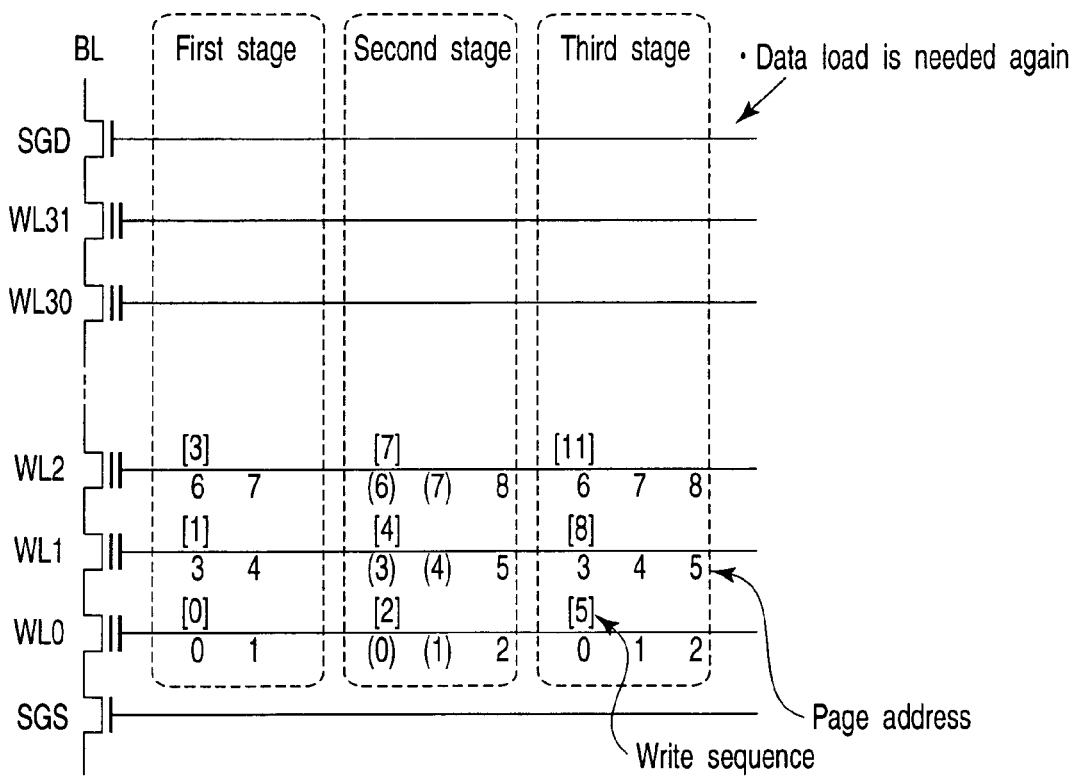
FIG. 19 shows the first modification of the first to third embodiments.

FIG. 15 shows a case where one NAND cell shown in FIG. 4 is written into as described above. In FIG. 15, the same write sequence as that in FIG. 13 is used and the same page addresses are indicated by the same reference numerals. Even in the case of the write operation shown in FIG. 15, the threshold levels of the individual memory cells change as shown in FIG. 14. Therefore, the write operation shown in FIG. 15 also has the same problem as described above.

To overcome this problem, the first embodiment uses the following write operation to prevent the threshold levels from fluctuating as a result of the operation of writing data into adjacent cells.

Figure 1:
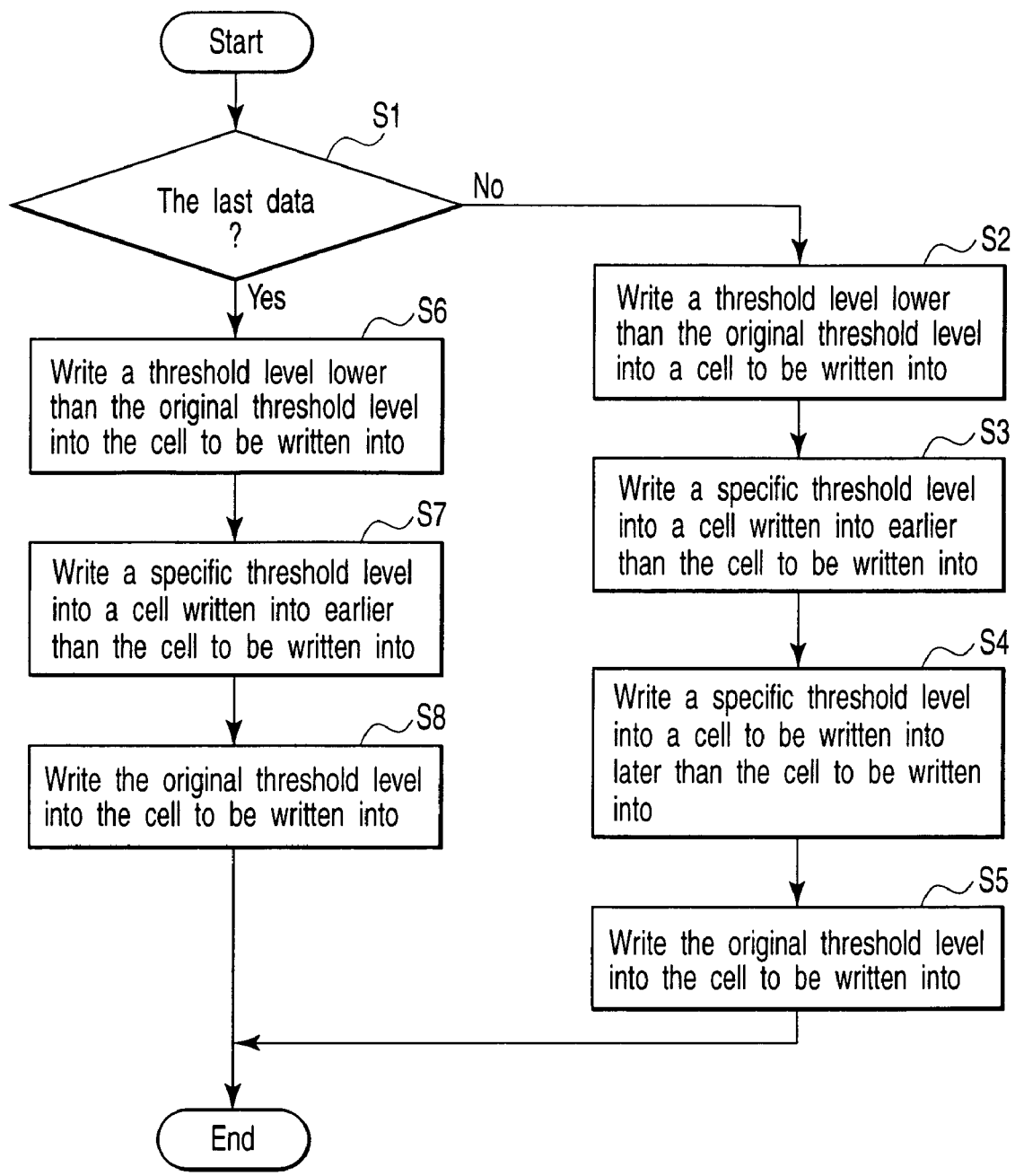
FIG. 1 is a flowchart to explain the operation of a first embodiment of the invention.

FIG. 1 is a flowchart to explain a write operation in the first embodiment. The write operation is carried out by, for example, the control signal and control voltage generator circuit 7 shown in FIG. 2 or the host 11. Referring to FIGS. 14 and 15, a write operation will be explained.

In the case of a write sequence shown in FIGS. 14 and 15, first, it is determined whether the data sent from the host 11 is the last data. The write operation differs, depending on whether the data is the last data or not, that is, the next page is to be written into consecutively.

Specifically, first, it is determined whether the data sent from the host 11 is the last one or not (S1). For example, it is determined whether the data sent from the host 11 is present. As a result, if the sent data is present and is not the last data, the cell to be written into is written into to a level lower than the original threshold level as described above. For example, the page addresses 3, 4, 5 in writing [1] do not hold the last data, a threshold level lower than the original threshold level is written into the page addresses 3, 4, 5 of the memory cell connected word line WL1 shown in writing [1] (S2). That is, in this case, a program verify operation is carried out using a verify level lower than the original verify level. Thereafter, a specific threshold level is written into the adjacent cells. Specifically, the original verify level is written into the cell written into earlier than the cell to be written into, that is, the page addresses 0, 1, 2 of the memory cell connected to word line WL0 shown in writing [2] (S3). Then, a lower threshold level than the original threshold level is written into the cell written into later than the cell to be written into, that is, the page addresses 6, 7, 8 of the memory cell connected to word line WL2 shown in writing [3] (S4).

Thereafter, the original threshold level is written into the cell to be written into (S5). That is, the original threshold level is written into the page addresses 3, 4, 5 of the memory cell connected to word line WL1 shown in writing [4]. Such an operation is carried out according to the data sent from the host 11.

On the other hand, for example, if the data in the page addresses 3, 4, 5 in writing [1] are the last data, the operation goes as follows. In step S1, if it has been determined that the data in the page addresses 6, 7, 8 in writing [3] following the page addresses 3, 4, 5 in writing [1] have not been sent from the host 11, control is passed to step S6. In step S6, a lower threshold level than the original threshold level is written into the page addresses 3, 4, 5 of the memory cell connected to word line WL1 shown in writing [1]. That is, in this case, a program verify operation is carried out using a verify level lower than the original verify level. Thereafter, a specific threshold level is written into the adjacent cells (S7). Specifically, on the basis of the data in the page addresses 0, 1, 2 already sent, the original verify level is written into the memory cell connected to word line WL0 shown in writing [2], that is, the page addresses 0, 1, 2 of the cell written into earlier than the cell to be written into.

Thereafter, the original threshold level is written into the cell to be written into (S8). That is, on the basis of the data in the page addresses 3, 4, 5 received last, the original threshold level is written into the page addresses 3, 4, 5 of the memory cell connected to word line WL1 as shown in writing [4]. Such an operation is carried out according to the data sent from the host 11.

Thereafter, as time advances and when writing is done again, the cell adjacent to the memory cell last written into is not written into and a cell separate from the memory cell last written into is written into. Specifically, as described above, if the page addresses 3, 4, 5 were written into last in writing [1], the host 11 performs control in such a manner that the page addresses 6, 7, 8 in writing [3] are not written into and writing is done, starting from, for example, the page addresses 9, 10, 11 in writing [5].

Specifically, when the data in the page addresses 9, 10, 11 in writing [5] are sent from the host 11 after the restart of writing, control is passed from step S1 to step S2 to step S5, where the same writing operation as described above is carried out. Therefore, the threshold voltage of the data in the cells at the page addresses 0, 1, 2 and the page addresses 3, 4, 5 will not rise through the coupling between the floating gates.

While in the above explanation, data has been written into the cell located in writing [5] in place of writing [3], the invention is not limited to this. For instance, data may be written into the cell located in writing [7] (not shown) adjacent to writing [5] in the direction of word line.

According to the first embodiment, when the write data is the last data, the original threshold level is written into the memory cell. Therefore, since the memory cell written into last has been written into before the data for the adjacent cells reaches, a fluctuation in the threshold level due to time passage can be prevented.

Furthermore, when writing is started again, the cell adjacent to the memory cell last written into in the preceding write operation is not written into and data is written into a cell separate from the memory cell last written into. Therefore, it is possible to prevent a fluctuation in the threshold level of the cell written into last in the preceding write operation.

While the memory cell array with the configuration of FIG. 15 has been explained, the same holds true for the memory cell array shown in FIG. 13.

Moreover, the adjacent cells are not restricted to the cells adjoining a specific memory cell in the direction of word line or bit line. For example, in FIG. 13, if a specific memory cell is a memory cell in writing [2], the memory cell in writing [7] diagonally adjoins the memory cell in writing [2]. If the coupling capacity between the memory cell in writing [7] and the memory cell in writing [2] is large, when data is written into the memory cell in writing [7], the threshold level of the memory cell in writing [2] fluctuates. Therefore, a memory cell arranged diagonally to a specific memory cell is also regarded as an adjacent cell, when the coupling capacity between the memory cell and the specific memory cell is large. If the coupling capacity between a memory cell arranged diagonally to a specific memory cell and the specific memory cell is small, the memory cell is not treated as an adjacent cell.

SECOND EMBODIMENT

Figure 16:
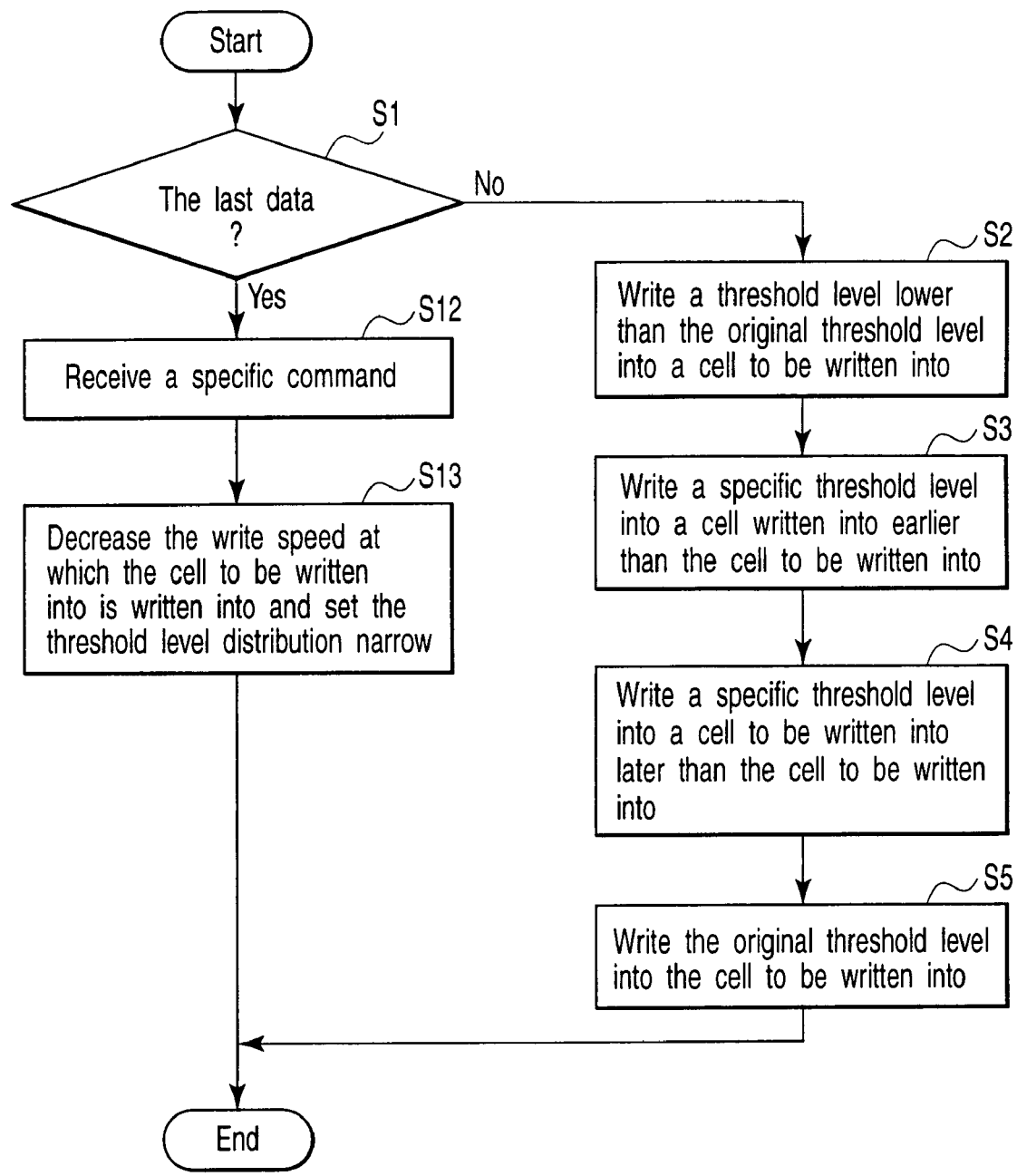
FIG. 16 is a flowchart to explain the operation of a second embodiment of the invention.

FIG. 16 shows a second embodiment of the invention. The same parts as those in FIG. 1 are indicated by the same reference numerals. In the second embodiment, the host 11 outputs a specific command, for example, a command to lower the write speed, following the last data supplied to the NAND flash memory, and the control signal and control voltage generator circuit 7 decreases, for example, the write speed according to the command.

For example, in the write sequence shown in FIG. 15, the same write operation as described above is carried out according to steps S11, S2, S3, S4, and S5 shown in FIG. 16 until the host 11 outputs a specific command.

On the other hand, for example, if the page addresses 3, 4, 5 are the last ones, control is passed from step S11 to step S12. In this case, the host 11 outputs a specific command following the page addresses 3, 4, 5. Receiving the command (S12), the control signal and control voltage generator circuit 7 lowers, for example, the write speed for the cell to be written into (S13). Specifically, the control signal and control voltage generator circuit 7 shortens, for example, the applying time of the program voltage supplied to the word line or sets an increment in the program voltage smaller. Lowering the write speed enables the distribution of each threshold level to be set narrower than the original threshold level distribution as shown in FIG. 14E.

As described above, when each threshold level distribution is set narrower, even if the threshold level of the cell previously written into becomes wider by the coupling between the floating gates of the adjacent cells as a result of the adjacent cells being written into in the next writing, the interval between the individual levels can be secured as shown in FIG. 14F. Accordingly, the individual levels can be read out.

In the second embodiment, the host 11 supplies a specific command following the last write data. According to the command, the threshold level of the cell written into last is set narrower than the original threshold level distribution. Therefore, even when data is written into an adjacent cell, it is possible to prevent the threshold level distribution of the cell already written into from spreading too much and therefore to secure a margin in reading.

In the case of FIG. 13, the threshold level of the last cell but one is distinguished from that of the cell written into last by a command, depending on the situation.

THIRD EMBODIMENT

Figure 17:
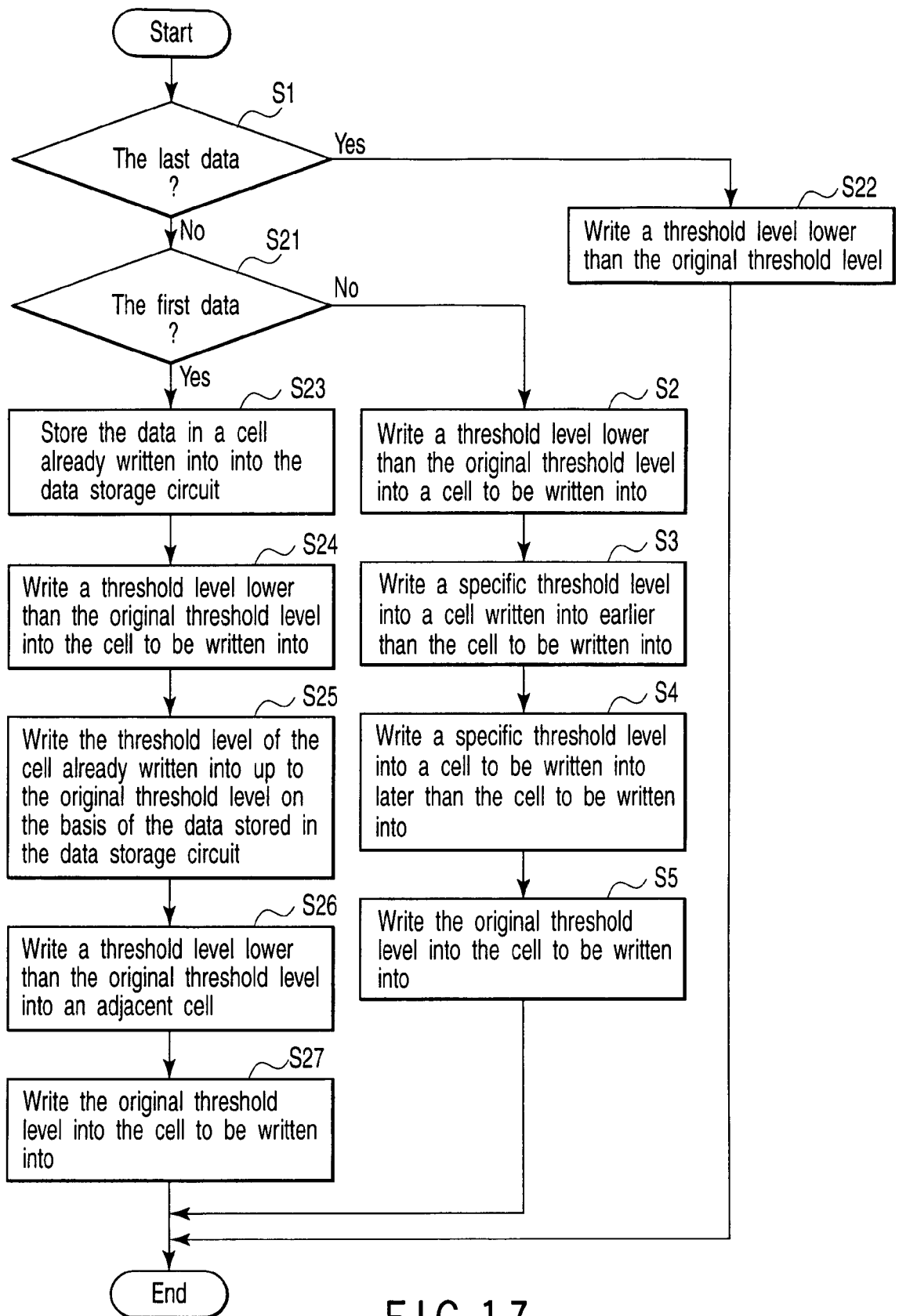
FIG. 17 is a flowchart to explain the operation of a third embodiment of the invention.
Figure 18:
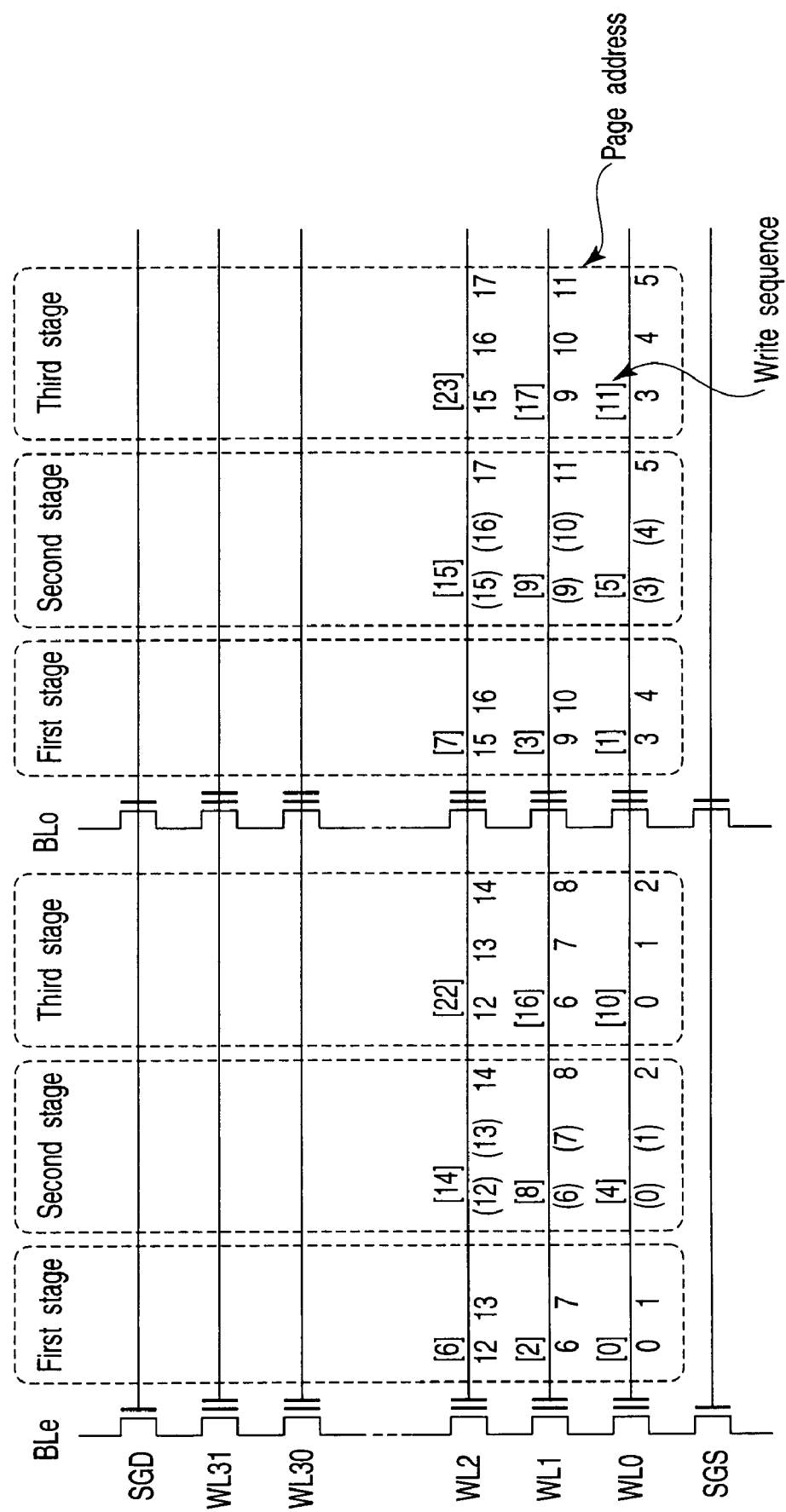
FIG. 18 shows a first modification of the first to third embodiments.
Figure 21:
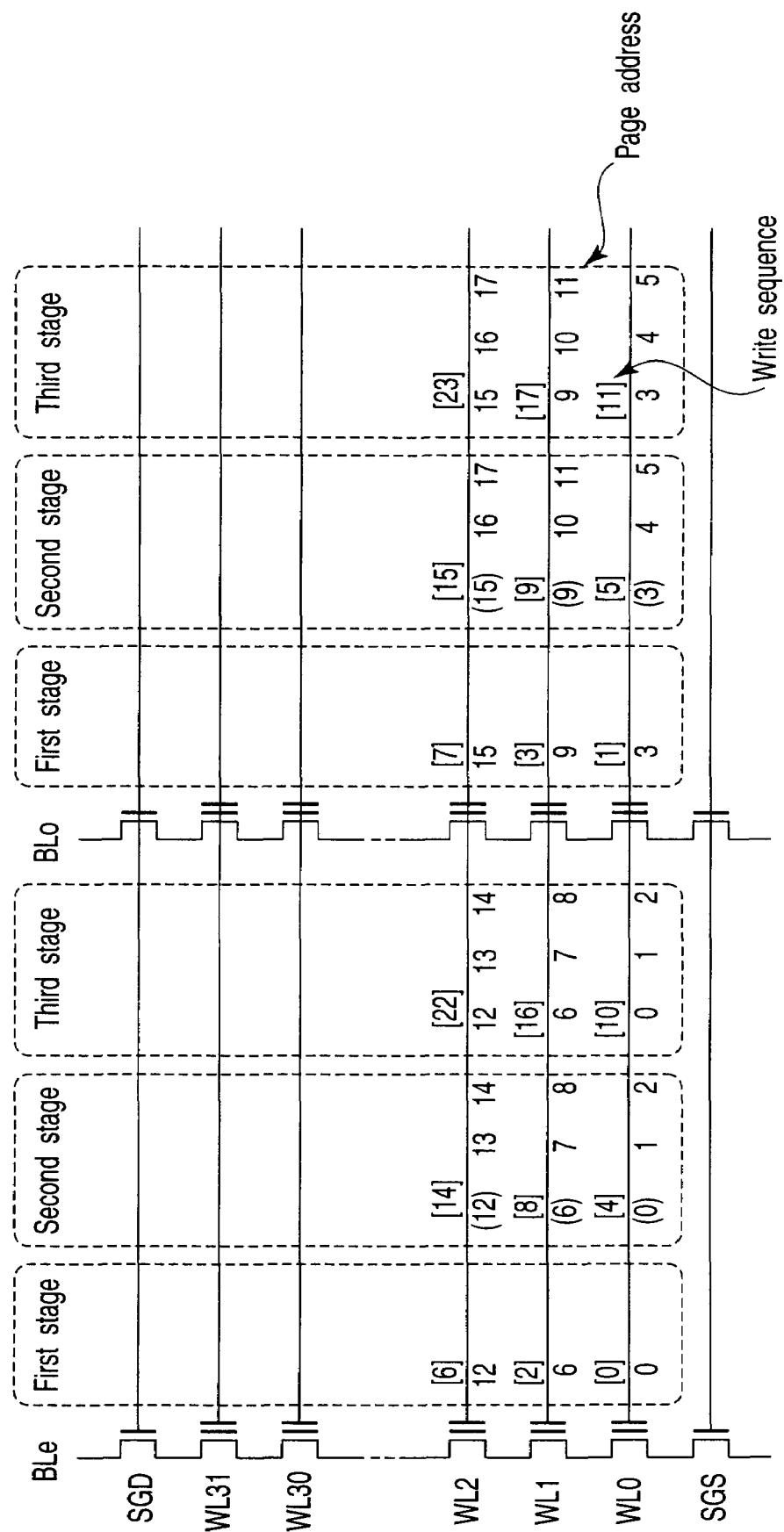
FIG. 21 shows a second modification of the first to third embodiments.
Figure 22:
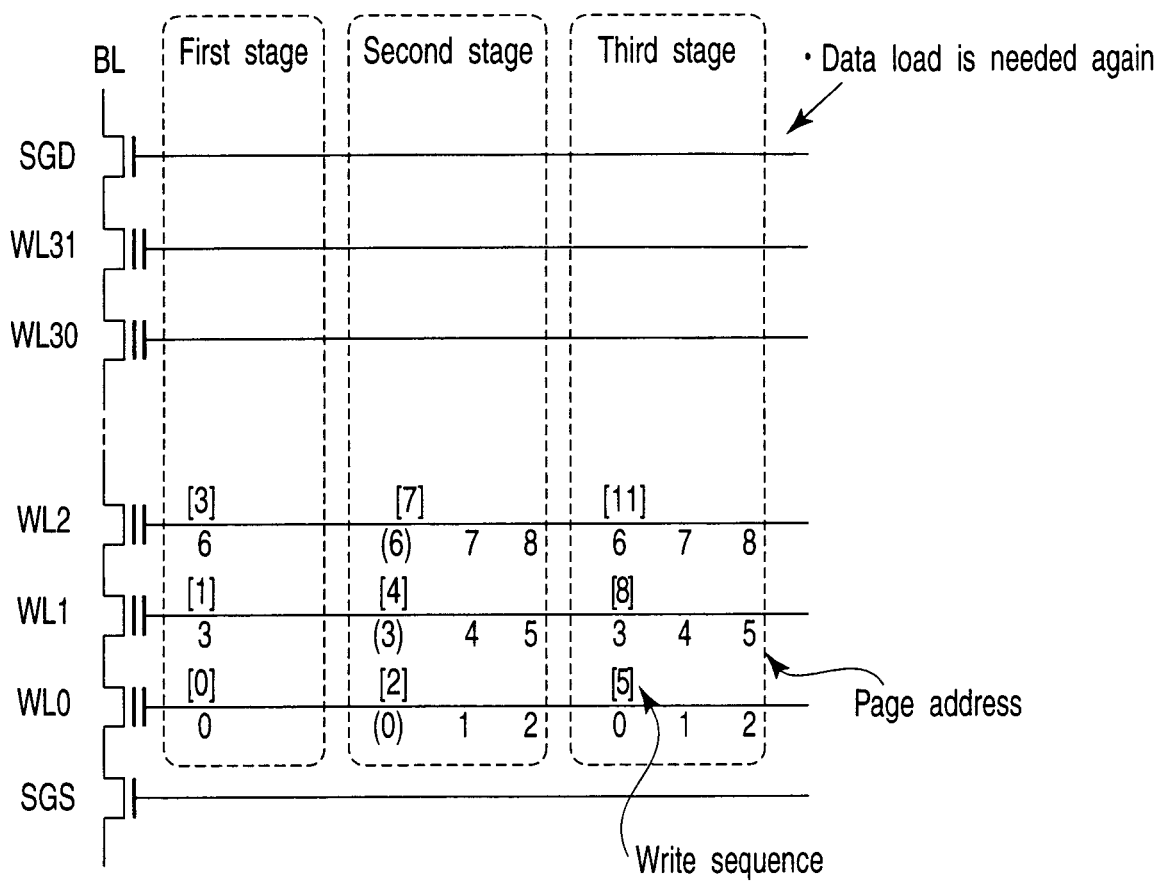
FIG. 22 shows the second modification of the first to third embodiments.

FIG. 17 shows a third embodiment of the invention. The same parts as those in FIG. 1 are indicated by the same reference numerals.

For example, in the write sequence shown in FIG. 15, the operation excluding the beginning and end of the write operation is the same as in the first embodiment. In FIG. 15, for example, if the page addresses 3, 4, 5 in writing [1] is for the last writing, that is, if the host 11 has not sent data for writing [3], control is passed from step S1 to step S22, where a lower threshold level than the original threshold level is written into the cell to be written into as shown in FIGS. 14A and 14B.

Thereafter, when writing is started again and the host 11 supplies a write command together with the write data for adjacent cells, control is passed from step S21 to step S23. In step S23, for example, the host 11 supplies the data in the page addresses 6, 7, 8 shown in writing [3] for the preceding writing [1], the data in the cell written into at the lower level than the original threshold level in writing [1] is read out before the writing of the data and is then stored in the data storage circuit 10 shown in FIG. 4. Then, in writing [3], the cell to be written into is written into at the lower threshold level than the original one (S24). Thereafter, in writing [4], on the basis of the data stored in the data storage circuit 10, writing is done so that the threshold level of the cell written into in writing [1] may reach the original threshold level (S25). Then, in writing [5], the lower threshold level than the original one is written into the adjacent cells (S26). The data in the page addresses 3, 4, 5 shown in writing [4] supplied from the host 11 are written to the original threshold level (S27).

In the third embodiment, when the data written into the cell is the last data, the lower threshold level than the original one is written into the cell. In the next writing, when data is written into an adjacent cell, the already written data is saved to the data storage circuit 10. After the lower threshold level than the original one is written into the adjacent cell, the threshold level of the cell previously written into is set to the original threshold level on the basis of the data saved to the data storage circuit 10. Therefore, when data is written into the adjacent cell after writing is started, it is possible to prevent the threshold level of the memory cell previously written into from getting wider by the coupling.

While in the third embodiment, the last written data is saved to the data storage circuit 10 in the next writing, the invention is not limited to this. For instance, the data may be saved to, for example, the host 11.

In the first to third embodiments, the case where 8-level data is written in the first stage of writing has been explained. This invention is not limited to this.

While in the first to third embodiments, the explanation has been given using FIG. 15, they may be applied to the write sequence shown in FIG. 13.

FIGS. 18 and 19 and FIGS. 20A to 20F are diagrams to explain a first modification of the first to third embodiments. In the first modification, on the basis of 2 bits of data (data on the lower page and upper page), 4 levels are written (FIG. 20A). Then, 4 levels are written into an adjacent cell (FIG. 20B). Next, on the basis of 1 bit of data (higher page) or 3 bits of data (lower page, upper page, and higher page), 8 levels are written to a lower threshold level using a lower verify level (FIG. 20C). Thereafter, 4 levels are written into the adjacent cell. Moreover, using 1 bit of data (higher page) or 3 bits of data (lower page, upper page, higher page), 8-level threshold levels are written into the adjacent cell (FIG. 20D). Then, using 3 bits of data (lower page, upper page, higher page) and the original verify level again, eight levels are written to the original level (FIG. 20E). Similarly, 8 levels are written in the adjacent cell (FIG. 20F).

FIGS. 21 and 22 and FIGS. 23A to 23F are diagrams to explain a second modification of the first to third embodiments. In this modification, first, using 1 bit of data (lower page), two levels are written (FIG. 23A). Thereafter, 2 levels are written into an adjacent cell (FIG. 23B). Then, on the basis of 2 bits of data (upper page, higher page) or 3 bits of data (lower page, upper page, higher page), 8 levels are written to a lower verify level (FIG. 23C). Thereafter, using 2 bits of data (upper page, higher page) or 3 bits of data (lower page, upper page, higher page), 8 levels are written into the adjacent cell (FIG. 23D). Then, using 3 bits of data (lower page, upper page, higher page) again, 8 levels are written to the original threshold level (FIG. 23E). Similarly, 8 levels are written into the adjacent cell (FIG. 23F).

In a third modification of the first to third embodiments, the distribution width of the threshold level shown in FIG. 23E lies between the threshold level distribution width shown in FIG. 14D and that shown in FIG. 20E.

The first and second modifications are effective when the coupling between the floating gates is large.

Various operations applied to the first to third embodiments will be explained below.

(Address Input and Data Input)

Figure 24:
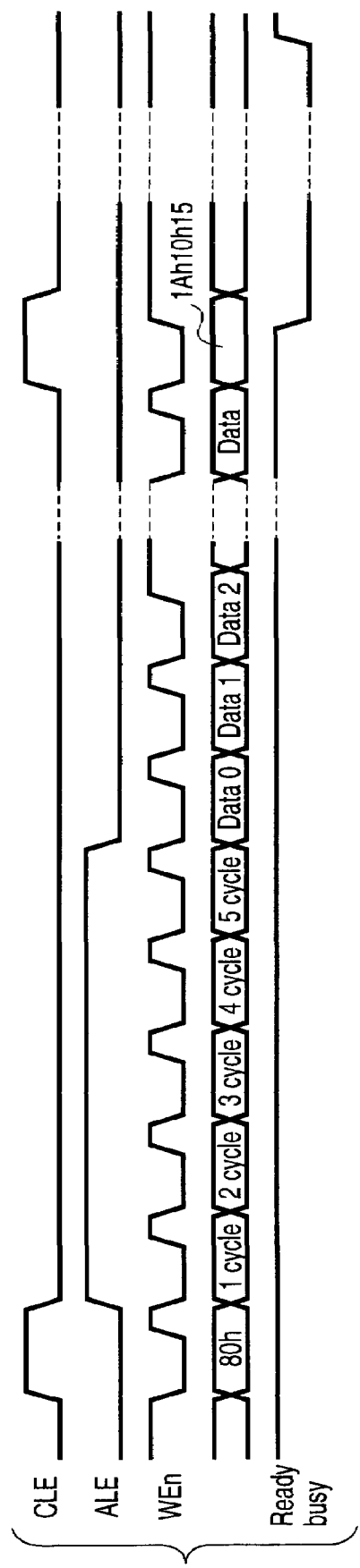
FIG. 24 shows the input timing of addresses and data.

FIG. 24 shows the timing of the input of addresses and data. As shown in FIG. 24, a data load command (80h, h represents hexadecimal), an address, and write data are input. The write data is stored into the data storage circuit 10 in the plane specified by the address, specifically into the SDC shown in FIG. 8. Thereafter, a data transfer command (1Ah) or a write command (10h or 15h) is input. Then, the data in the SDC in the data storage circuit 10 in the selected plane is transferred to the PDC and further transferred to the DDC. Thereafter, the data cache is operated. When the host 11 inputs data "1" (unwriting), node N1a of the PDC goes high. When the host 11 inputs data "0" (writing), node N1a of the PDC goes low. Thereafter, let data in the PDC be the potential at node N1a and the data in the SDC be the potential at node N2a.

FIG. 25A shows the relationship between commands and data applied to the first modification. In this case, 2-bit (4-level) data is written in the first stage. First, an address and data for the lower page are input and a data transfer command (1Ah) is input. Thereafter, an address and data for the upper page are input and then a write command (10h or 15h) is input. In the circuit, since the address for the upper page has been input, it is seen that 4-level data is to be written.

FIG. 25B shows the relationship between a command and data applied to the second modification. In this case, 1-bit (2-level) data is written in the first stage. To do this, first, an address and data for the lower page are input and a write command (10h or 15h) is input.

FIG. 25C shows a case where 2-bit (4-level) data is written in the first stage. In this case, even if the lower page is replaced with the upper page, since the upper page has already been input, it is possible to recognize that 4-bit data is to be written.

FIG. 25D shows a case where 8-level data is written to a lower threshold level (a first time). To distinguish the case from a case where the 8-level data is written to the final value (a second time), a command (0Dh) is added. In this case, first, an address and data for the lower page are input. Then, after a data transfer command (1Ah) is input, an address and data for the upper page are input and then a data transfer command (1Ah) is input. Thereafter, an address and data for the higher page are input and then a write command (10h or 15h) is input.

FIG. 25E shows a case where the data on the 2-level lower page has already been written before 8-level data is written to the lower threshold level. In this case, there is no need to input data for the lower page from the outside. The data on the lower page is read from the memory cell and stored in the data storage circuit 10. That is, an internal data load is carried out. Accordingly, after the upper page address and data are input and the data transfer command (1Ah) are input, the higher page address and data are input and the data transfer command (1Ah) are input. As described above, in addition to using the internal data load, the data for the lower page may be externally input again as in FIG. 25D.

FIG. 25F shows a case where the data on the 4-level lower page and upper page has already been written before 8-level data is written to the lower threshold level. In this case, there is no need to input data for the lower page and upper page from the outside. The data on the lower page and upper page is read in an internal data load. Therefore, the higher page address and data are input and a write command (10h or 15h) is input. As described above, not only may the internal data load be used, but also the data for the lower page and upper page may be externally input again as in FIG. 25D.

FIG. 25G shows a case where 3-bit (8-level) data is written. In this case, first, an address and data for the lower page are input and a data transfer command (1Ah) is input. Thereafter, an address and data for the upper page are input and then a data transfer command (1Ah) is input. Then, an address and data for the higher page are input and then a write command (10h or 15h) is input. Since the address of the higher page has been input, it is recognized that 3-bit (8-level) data is to be written.

It is also possible to change the input address and the location of data as shown in FIG. 25H in place of FIG. 25G. Moreover, the internal data load may be used.

(Data Transfer Command)

When the host 11 supplies a data transfer command (1Ah), the data in the SDC in the data storage circuit 10 in the selected plane is transferred to the PDC and further to the DDC. Since the DDC is a capacitance, a refresh operation is needed. Therefore, after the transfer command (1Ah) has been input, when the transfer of data to the DDC has been completed, the chip changes from the busy state to the ready state to wait for the next data to be input. In the chip, a refresh operation is repeated.

(Write Sequence, Data Load, Program Set)

FIG. 26 shows a write sequence. FIGS. 27A to 27E show the data in the corresponding sections. FIG. 27A shows the relationship between the data supplied from the host 11 and the write levels. In step 31 of FIG. 26, after "80h-Add-data" is executed, an arbitrary page (e.g., 2 kB) of data is supplied from the host 11 to the SDC. If only one page of data is input, a write command 10h or a cache write command 15h is input (S32). If a plurality of pages of data are input, command 1Ah is input (S33). In the case of a first command 1Ah, the data in the SDC is transferred to the DDCA (LDDC1). In the case of a second command 1Ah, the data in the SDC is transferred to, for example, DDCB (LDDC0). In the case of a third command 1Ah, the data in the SDC is transferred to DDCC (LDDCQ). Here, each of LDDC0, LDDC1, and LDDCQ shows the data stored in any one of DDCA, DDCB, and DDCC. These pieces of data are stored in any one of DDCA, DDCB, and DDCC by a refresh operation via the SDC.

Thereafter, write command 10h or write a cache-function-added command 15h is input (S35, S36), bringing the chip into the busy state.

In the chip, when an internal data load is carried out after the data in the SDC is transferred to LDDCQ (S37), the data is loaded from the memory cell. The result is transferred to LDDCQ and LDDC1. FIG. 27C shows the relationship between the data input from the host 11, the data input by the internal data load, and the data stored in the data cache after input.

Thereafter, data cache operation and data cache are defined (S38) (FIG. 27D). In this example, the difference between writing and unwriting is stored in the PDC. In the case of writing, it follows that PDC=0. In the case of unwriting, it follows that PDC=1.

In addition to the original verify level, a lower verify level is set. Writing after the lower verify level has been exceeded is made lower, which enables the writing distribution to be made narrower. Whether the lower verify level has been exceeded is stored in LDDCQ. If the lower verify level has not been exceeded, 0 is set in LDDCQ (LDDCQ=0). If the lower verify level has been exceeded, 1 is set in LDDCQ (LDDCQ=1).

When 8-level data is written, 3 bits are needed to distinguish 8 levels. In this case, SDC, LDDC1, and LDDC0 are used. When 4-level data is written, 2 bits are needed to distinguish 4 levels. In this case, LDDC1 and LDDC0 are used. When 2-level data is written, 1 bit is needed to distinguish 2 levels. In this case, LDDC0 is used. These writing levels and the data set in the data caches are shown in FIG. 27E. Definitions are made, starting from a low to a high threshold level and from level 0 to level 7. As a result of an erase operation, the writing level goes to level 0. As a result of a write operation, the writing level changes from level 1 to level 7. There may be a case where writing is done to level 0.

In an REASB (Revised Erased Area Self Boost) write operation, the selected word line is set at the program voltage Vpgm (24 V). The word line adjacent to the selected word line on the source side is set at Vpass or an intermediate potential. The potential of a word line adjacent to the word line is set at the ground potential Vss, preventing erroneous writing. However, when the threshold voltage of the erased cell is too low, the cell cannot be turned off.

In the course of writing data, the writing of data to a lower threshold value is completed earlier than the writing of data to a higher threshold value. Therefore, in a case where the cache-function-added write command 15h has been input, when the writing of data to level 0 to level 3 has been completed in writing 8 levels, the data in the SDC becomes unnecessary. Therefore, the ready state is output outside the chip and the next write data is input. Thereafter, command 1Ah/10h/15h is input, thereby bringing the chip into the busy state.

When the writing of data to level 4 to level 5 has been completed, the data in LDDC1 becomes unnecessary. Therefore, after the data in the SDC is transferred to LDDC1, the ready state is output outside the chip. Then, the next write data is input to the SDC. Thereafter, command 1Ah/10h/15h is input, thereby bringing the chip into the busy state.

Furthermore, when the writing of data to level 6 has been completed, the data in LDDC0 becomes unnecessary. Therefore, after the data in the SDC is transferred to LDDC0, the ready state is output outside the chip. Then, the next write data is input to the SDC. Thereafter, command 1Ah/10h/15h is input, thereby bringing the chip into the busy state. Then, the chip is brought into the busy state by the write command 15h or 10h. After the preceding page has been written into, the operation of writing data into the next page is started.

When 4 levels are written, the SDC is not used from the beginning. Therefore, after the data cache is operated, the ready state is output outside the chip and the next write data is input. Thereafter, command 1Ah/10h/15h is input, thereby bringing the chip into the busy state.

When the writing of data to level 0 to level 1 has been completed, the data in LDDC1 becomes unnecessary. Therefore, after the data in the SDC is transferred to LDDC1, the ready state is output outside the chip. Then, the next write data is input to the SDC. Thereafter, command 1Ah/10h/15h is input, thereby bringing the chip into the busy state.

Furthermore, when the writing of data to level 2 has been completed, the data in LDDC0 becomes unnecessary. Therefore, after the data in the SDC is transferred to LDDC0, the ready state is output outside the chip. Then, the next write data is input to the SDC. Thereafter, the chip is brought into the busy state by the write command 15h or 10h. After the preceding page has been written into, the operation of writing data into the next page is started.

When 2 levels are written, the SDC is not used from the beginning. Therefore, after the data cache is operated, the ready state is output outside the chip. Then, the next write data is input. Thereafter, command 1Ah/10h/15h is input, thereby bringing the chip into the busy state.

In writing two levels, LDDC1 is not used. Therefore, after the data in the SDC is transferred to LDDC0, the ready state is output outside the chip. Then, the next write data is input to the SDC. Thereafter, command 1Ah, 10h, or 15h is input, thereby bringing the chip into the busy state.

In writing two levels, LDDC0 is not used, either. Therefore, after the data in the SDC is transferred to LDDC0, the ready state is output outside the chip. Then, the next write data is input to the SDC. Thereafter, command 1Ah, 10h, or 15h is input, thereby bringing the chip into the busy state. Then, the chip is brought into the busy state by the write command 1Ah, 10h, or 15h. After the preceding page has been written into, the operation of writing data into the next page is started.

By doing this, the present circuit can be used even in a case where transfer command 1Ah appears three times consecutively, that is, where the next write data is for 3 pages and 8 levels. However, for example, when the next write data is for 2 levels, the data on the first page is input and then write command 10h or 15h is input.

(Program Setting)

After the definition of the data caches and the operation of the data caches (S38, S39), a program operation is carried out (S40).

In FIG. 8, with signal BLC1 set at Vdd+Vth (Vdd: for example, the power supply voltage, Vth: the threshold voltage of the n-channel MOS transistor), if data "1" (unwriting) is stored in the PDC, the bit line is at Vdd, and if data "0" (writing) is stored in the PDC, the bit line is at Vss. The cells connected to the selected word line on the unselected pages (whose bit lines are unselected) must not be written into. Therefore, the voltage Vdd is also applied to the bit lines connected to these cells. After signal BLC1 is set at Vss, signal REG of LDDCQ is made high. When the rather low verify level has been passed, the bit line is set at an intermediate potential. However, since no verify operation has not been carried out in a first write loop, the bit line is not set at the intermediate potential.

Here, Vdd is applied to the select line SGS (shown in FIGS. 3 and 4) of the selected block, Vpgm (24 V) is applied to the selected word line, and Vpass (10 V) is applied to the unselected word lines. In this situation, if the bit line is at Vss, the channel of the cell is at Vss and the word line is at Vpgm, which causes writing to be done. If the bit line is at Vdd, the channel of the cell is not at Vss and rises toward Vpgm and reaches about Vpgm/2 by coupling. Therefore, programming is not be done. If the bit line is at the intermediate potential, writing is done a little.

(Program and Program Verify Read)

A program operation and a verify operation (S41) shown in FIG. 26 are repeated.

FIG. 28 shows waveforms on a word line and a bit line in a verify sequence. First, after the bit line BL is charged for the first time, a verify operation is carried out by changing verify levels (0 VL, 1 VL to 7 VL) lower than the original verify levels (0 V, 1 V to 7 V) sequentially. Then, after the bit line BL is charged for the first time, a verify operation is carried out using the original verify levels (0 V, 1 V to 7 V). By such operations, a high-speed verify operation can be carried out.

Figure 29:
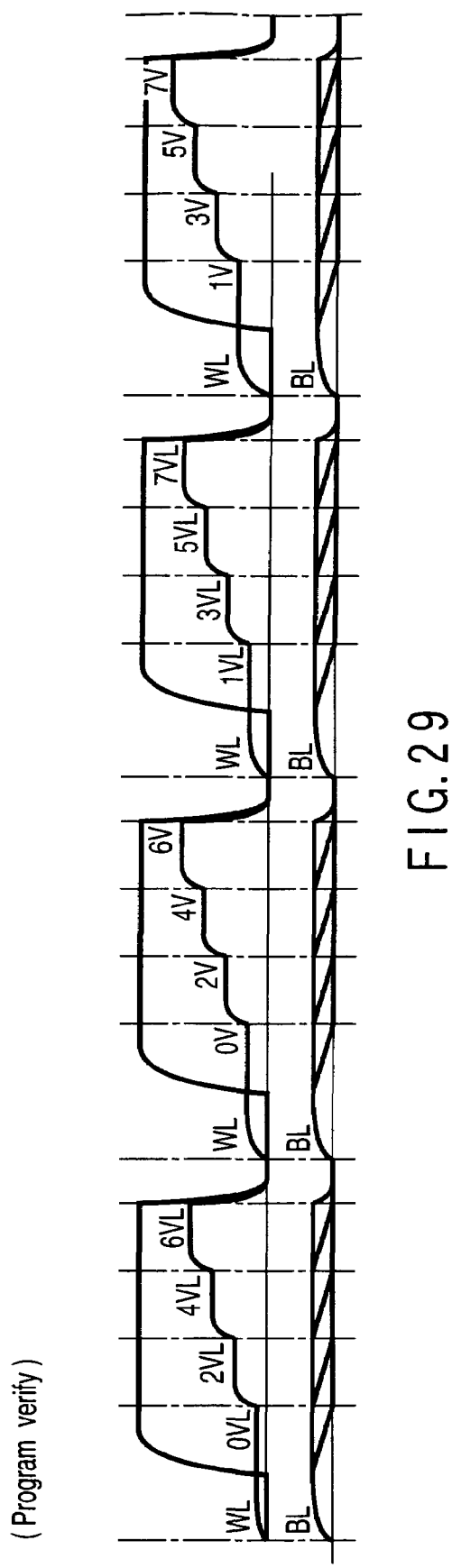
FIG. 29 shows a modification of FIG. 28.

FIG. 29 shows a modification of FIG. 28. When the potentials of the individual levels of the memory cell are close to one another, a verify operation is carried out at every other level consecutively as shown in FIG. 29. The reason is that, when, for example, a verify operation is carried out at level 3, if the potential at level 2 is close to the potential at level 3, current flows to the level-2 cells as well.

After the verify operation has passed at each level, the PDC changes from the low level to the high level, preventing writing from being done in the next program.

Although the program is executed a plurality of times, the cells to be written into at the high level have not been written into yet at the beginning of the program loop. A verify operation is carried out sequentially only at level 0 at first, then only at level 0 and level 1, and then only level 0, level 1, and level 2. Almost at the end of the program loop, the cells at the low level have been written into. Therefore, a verify operation is carried out only at level 5, level 6, and level 7 at first, then only at level 6 and level 7, and then only level 7. In this case, for example, when a verification operation is carried out at only level 6 and level 7, the waveform at level 6 differs from that at level 6 when verifying has been done consecutively at level 5, level 6, and level 7. Therefore, when verifying is done only at level 6 and level 7, verifying is done at level 5, level 6, and level 7. In this case, verifying at level 5 is a dummy. In the verify operation at level 5, the contents of the data cache are not changed.

(Program Voltage Step-Up)

In the verify operation, if it has been determined that writing is insufficient, the program voltage Vpgm is raised a little (S42). Thereafter, the program operation and program verify operation are repeated again.

(Program)

When the PDC is at the low level, the write operation is carried out again. The program operation and verify operation are repeated until the PDCs in all the data storage circuits 10 have gone to the high level (S40). That is, while the program operation is being carried out, a check is made to see if all the PDCs are at the high level.

(Erase Operation)

An erase operation is carried out in blocks shown by a broken line in FIGS. 3 and 4. In FIG. 3, erasing is done simultaneously on two bit lines (BLie, BLio) connected to a data storage circuit 10. After the erase operation, the threshold value of the cell goes to level 0 as shown in FIG. 12.

In an EASB (Erase Area Self Boost) writing method, the threshold level of a cell to be erased from has to be made shallow.

Figure 30:
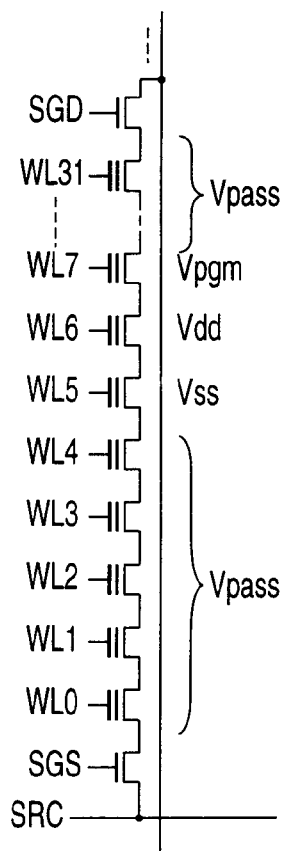
FIG. 30 is a diagram to explain an EASB writing method.

First, referring to FIG. 30, the EASB writing method will be explained. In the writing method, writing is always done from the source side. First, in the case of writing, the bit line is set at Vss. In the case of unwriting, the bit line is set at Vdd. Next, for example, when the cell connected to word line WL7 is to be written into, word lines WL0 to WL4 are set at Vpass, word line WL5 is set at Vss, word line WL6 is set at Vdd, word line WL7 is set at Vpgm, and word lines WL8 to WL31 are set at Vpass. At this time, in the case of writing, the gate of word line WL7 goes to Vpgm and the channel goes to Vss, which causes writing to be done. In the case of unwriting, the channel is boosted to, for example, Vpass/2. However, when the number of cells written into is large, the channel becomes hard to boost. In the case of the EASB writing method, however, writing is always done from the source side. Therefore, when word line WL5 is set at 0 V (Vss=0 V) and boosting is done, since the cells connected to word lines WL4 to WL31 have been erased from, the channels of these cells are boosted, which prevents writing. As described above, the boosted charge has to be prevented from moving to the cells already written into. When the cell connected to word line WL5 has been erased from and the threshold voltage is deep, the cell cannot be turned off. Therefore, the threshold voltage of the erased cell has to be made shallow.

For this reason, in the erase sequence, the threshold level of the erased cell is made shallower after the erasure. Alternatively, the threshold level is made shallower in the program sequence shown in FIGS. 14, 20, and 23. Moreover, the threshold level may be made shallower suitably in the erase sequence and then the threshold level is made shallower accurately in the program sequence. In the write sequence shown in FIG. 14, although the erased cells (level 0) are written into in the second stage, they may be written into in the first stage.

Figure 23:
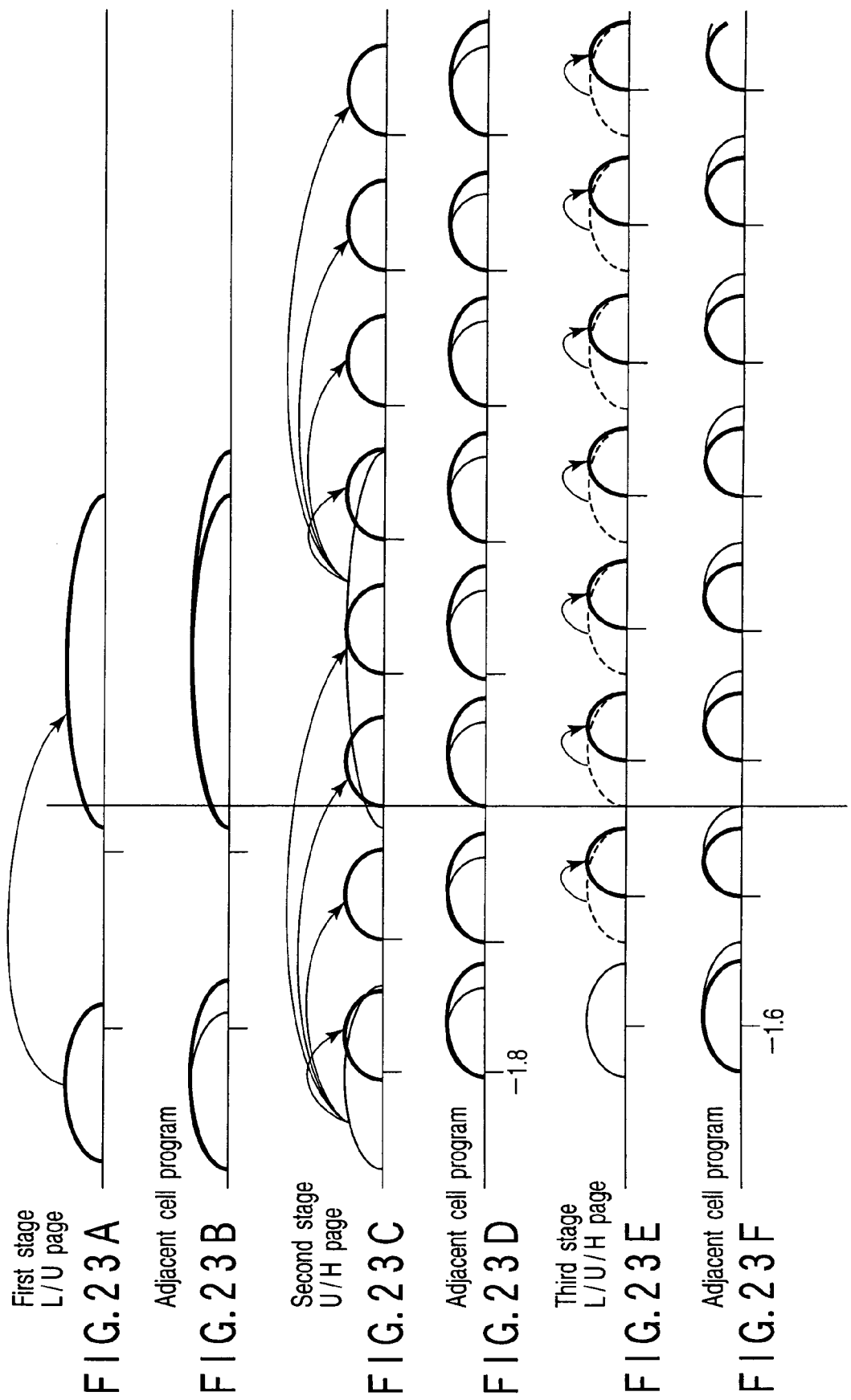
FIGS. 23A to 23F are diagrams to explain the operation of the second modification.

Furthermore, in the write sequence shown in FIGS. 20 and 23, although the erased cells (level 0) are written into in the second stage, they may be written into in the first stage or third stage.

(Read Operation)

Figure 31:
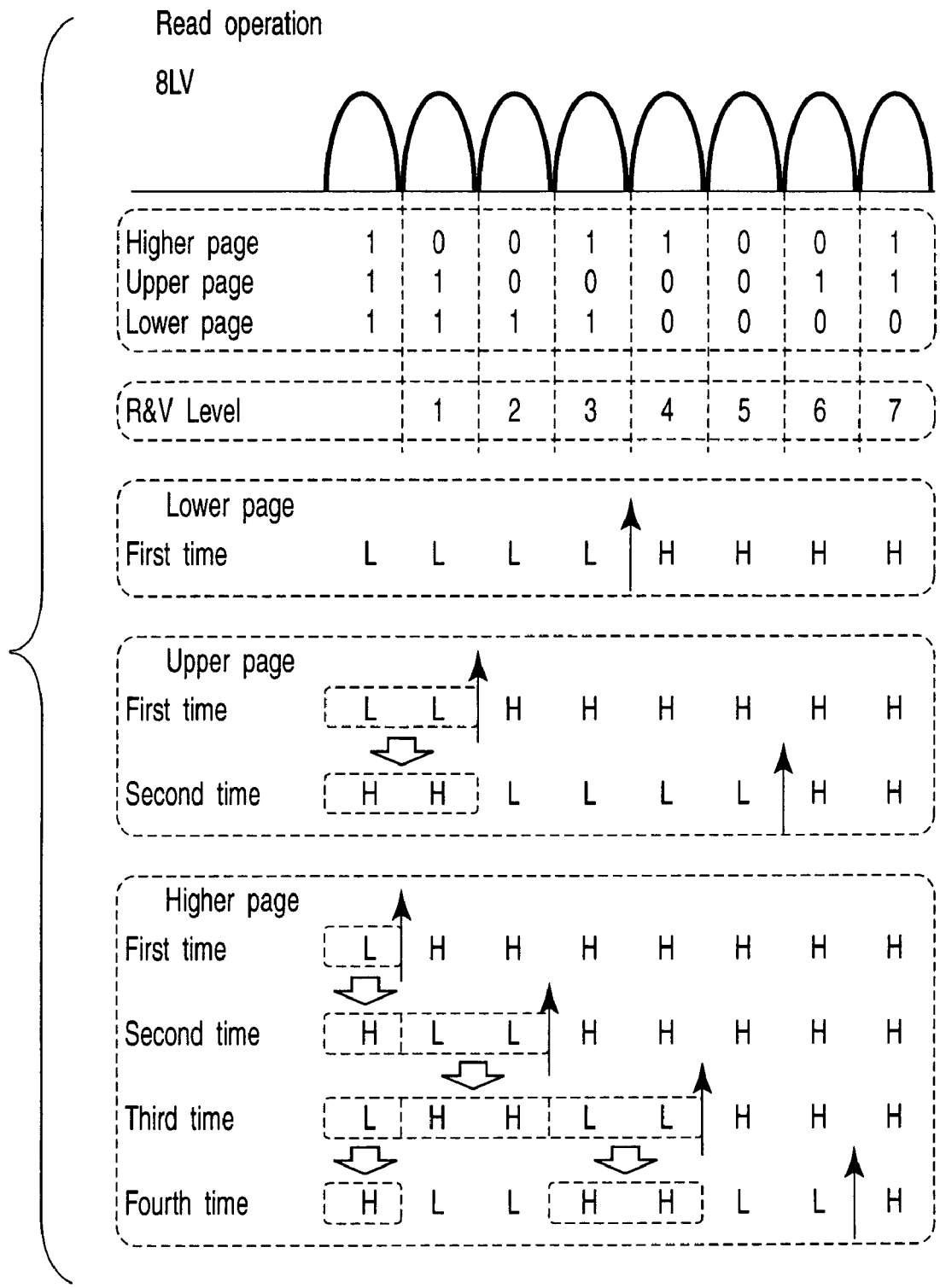
FIG. 31 shows a threshold level distribution after 8 levels have been written and data allocation.

FIG. 31 shows the threshold level distribution after 8 levels have been written and the allocation of data. In reading the data on the lower page, a read operation is carried out at level 4. As a result, when the cell has been turned on and the potential of the bit line has gone to the low level, the output data becomes "1". When the cell has been turned off and the potential of the bit line has gone to the high level, the output data becomes "0". In reading the data on the upper page, a read operation is carried out at level 6 and level 2. Therefore, 2-sequence reading is needed. To read the data on the higher page, a read operation is carried out at level 7, level 5, level 3, and level 1. Therefore, 4-sequence reading is needed.

Figure 32:
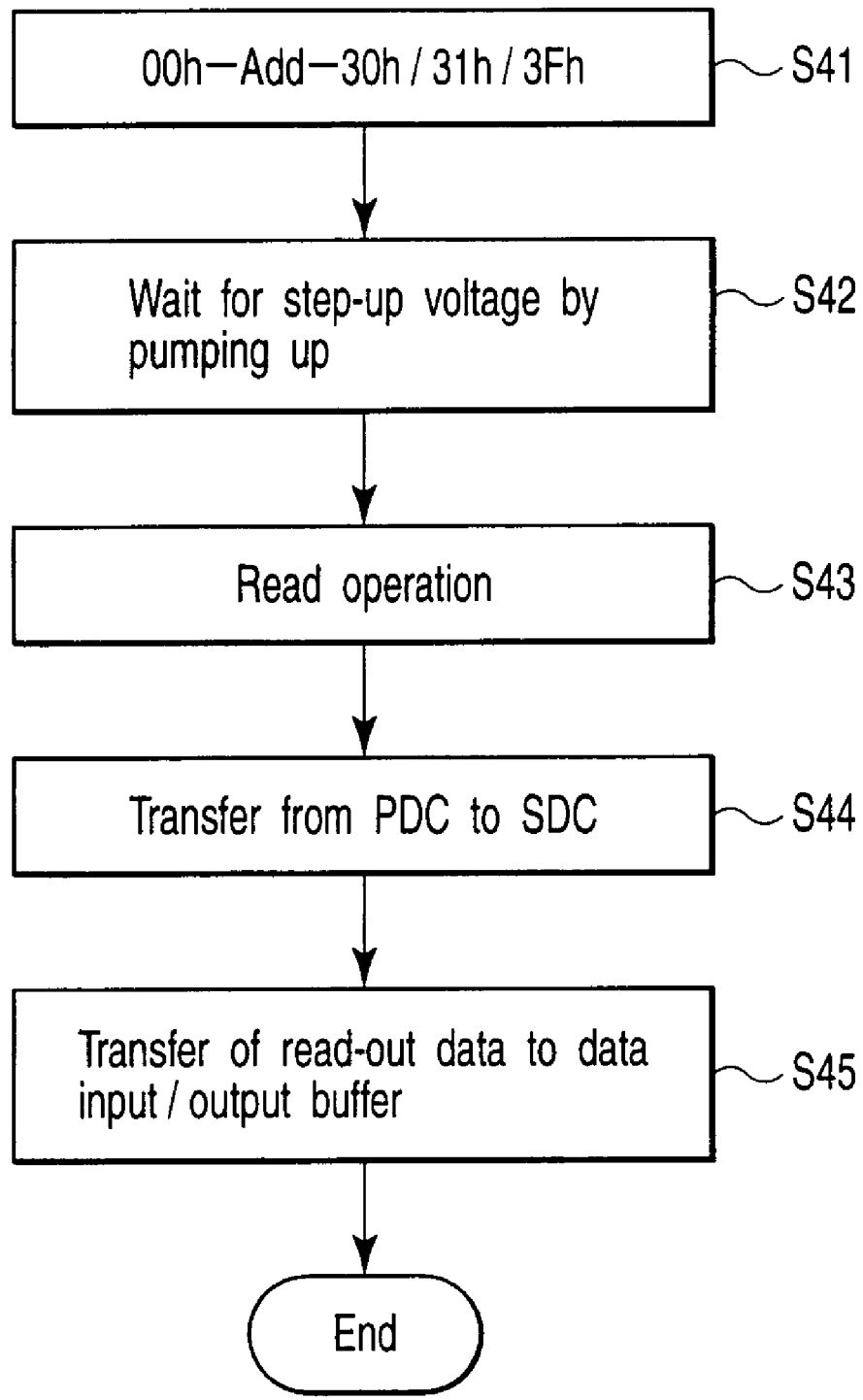
FIG. 32 shows an algorithm for a read operation.

FIG. 32 shows an algorithm for a read operation. In FIG. 32, when read command 00h, read address Add, and transfer command 30h/31h/3Fh are supplied (S41), the pump circuit (not shown) in the control signal and control voltage generator circuit 7 starts to a step-up operation, thereby generating a read voltage (S42). Thereafter, using the generated read voltage, a read operation is carried out (S43). The data read from the memory cell is transferred from the PDC of the data storage circuit 10 to the SDC (S44). Thereafter, the data in the SDC is transferred to the data input/output buffer 4 of FIG. 2 (S45). The data transferred to the data input/output buffer 4 is transferred via the data input/output terminal 5 to the host 11.

Figure 33:
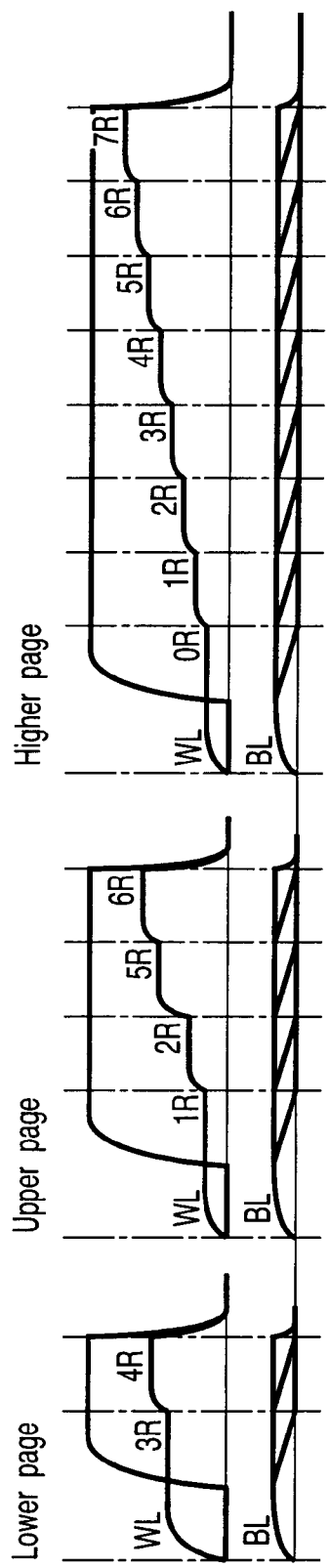
FIG. 33 shows waveforms on a word line and a bit line in a read operation when programming is done in the program verify operation of FIG. 28.

FIG. 33 shows waveforms on a word line and a bit line in a read operation when programming is done in a program verify operation shown in FIG. 28. In FIG. 28, for example, the verify operation at level 4 has been carried out following the verify operation at level 3. Therefore, in a read operation shown in FIG. 33, too, a read operation at level 3 is carried out as a dummy operation. After this, a read operation at level 4 is carried out.

Figure 34:
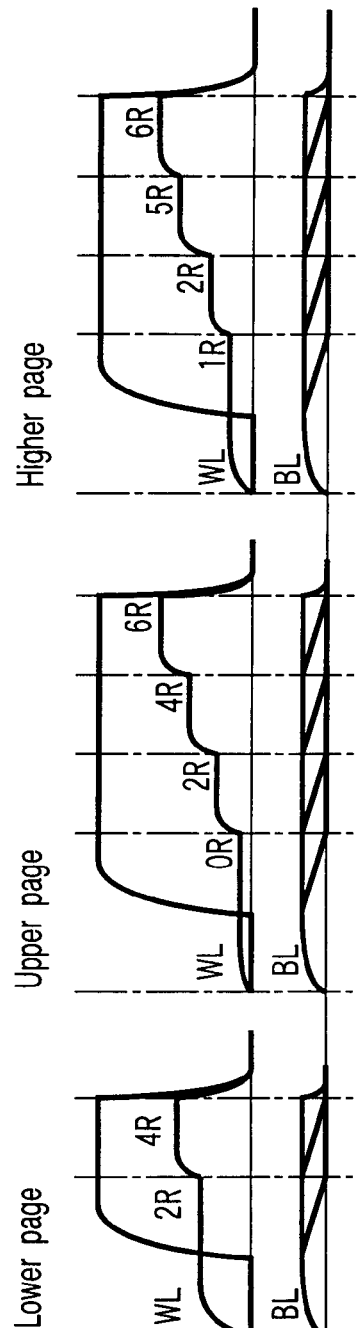
FIG. 34 shows waveforms on a word line and a bit line when programming is done in the program verify operation of FIG. 29.

FIG. 34 shows waveforms on a word line and a bit line in a read operation when programming is done in the program verify operation shown in FIG. 29. In FIG. 29, for example, the verify operation at level 4 has been carried out following the verify operation at level 2. Therefore, in a read operation, too, a read operation at level 2 is carried out as a dummy. After this, a read operation at level 4 is carried out.

Figure 37:
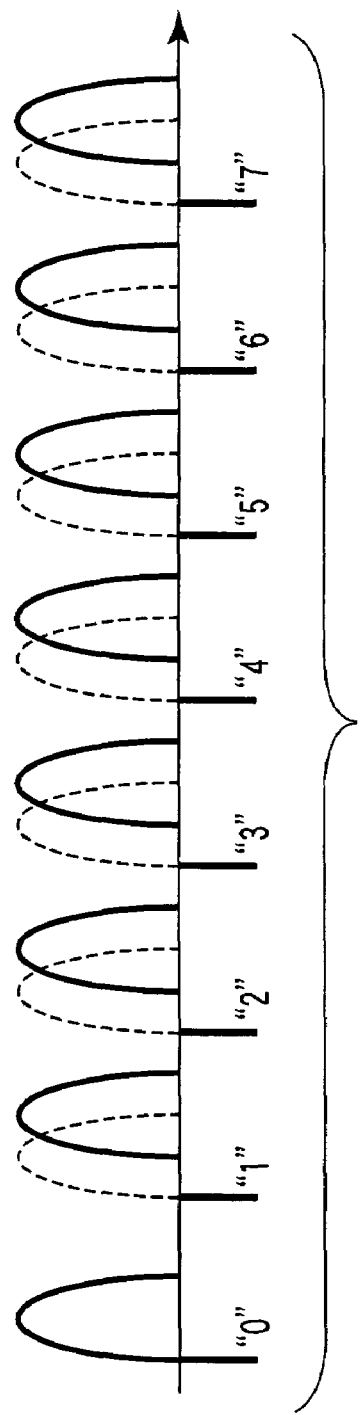
FIG. 37 shows verify levels.

As shown in FIG. 28, when the potential of the word line is changed continuously to verify the threshold level of the memory cell after the bit line is precharged once, the verified threshold distribution may be higher than the set verify levels "1", "2", ..., "7" as shown by solid lines in FIG. 37 (in FIG. 37, the broken lines show a threshold distribution as a target). The reason is that the precharged charge leaks from the bit line in a verify operation at the next threshold level below, or that, although the source line is floating a little when the bit line is read immediately after it is precharged, the source line is not floating when the bit line is read after time has passed since the precharging.

As described above, as a measure to prevent the threshold distribution from becoming higher than the verify level, the interval between the individual threshold levels can be made sufficient by carrying out a verify operation at every other level as shown in FIG. 29.

Moreover, as shown in FIGS. 33 and 34, data is read by the same method as in the program verify operation.

Figure 38:
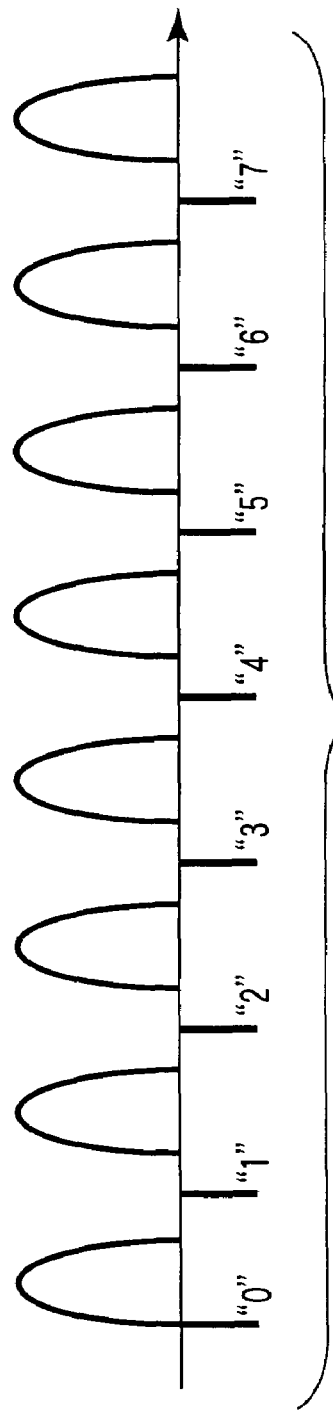
FIG. 38 shows a modification of the verify levels.

In addition, a correction value may be added to the verify level in advance. For example, when the threshold levels are written as shown by the solid lines in FIG. 37, the verify levels of the threshold levels "1", . . . , "7" are set lower in advance and writing is done as shown in FIG. 38. As a result, the threshold distribution is as shown by the solid lines in FIG. 38. Therefore, as shown in FIG. 33, reading may be possible even if reading is not done continuously in a read operation.

Furthermore, in a program verify operation shown in FIG. 28, for example, when the writing of data to level 0 and level 1 has been completed, the verify operation at level 0 is omitted and the verify operation at level 1 may be omitted. In a verify operation immediately after precharging, unlike other verify operations, the source potential is floating seriously. Therefore, the verify operation at level 1 is not omitted and is used as a dummy. Then, verify operations at level 1 to level 7 are carried out. Similarly, for example, when the writing of data to level 0, level 1, and level 2 has been completed, the verify operations at level 0 and level 1 are omitted, the verify operation at level 2 is used as a dummy, and the verify operations at level 2 to level 7 may be carried out. Similarly, for example, when the writing of data to level 0 to level 6 has been completed, the verify operations at level 0 to level 5 are omitted, the verify operation at level 6 is used as a dummy, and the verify operation at level 7 may be carried out.

FOURTH EMBODIMENT

As shown in FIG. 3 or 4, a NAND cell constituting a NAND flash memory is composed of 32 cells connected in series and select gates S1, S2. Word lines WL0 to WL31 are connected to the control gates of the cells. Select liens SGS and SGD are connected to the gates of the select gates S1, S2, respectively. When data is written into a cell connected to word line WL0, word line WL0 is set at Vpgm, word lines WL1 to WL31 are at Vpass, select line SGD is set at the power supply voltage Vdd or intermediate potential, and select line SGS is set at the ground potential Vss. When data "1" is written (writing unselected), the bit line is set at Vdd, the channel of the cell is booted and goes to a high potential, preventing the cell from being written into. When data is written into word line WL0, since word line WL0 is at the program voltage Vpgm, it is booted to a very high voltage. Moreover, since select line SGS is at the ground potential Vss, GIDL (Gate Induced Drain Leakage) takes place, causing a problem: the memory cell connected to word line WL0 is written into erroneously.

To avoid this problem, for example, in the case of 8 levels, although a single cell stores 3 bits, 43 cells are connected in series instead of 32 cells connected in series and, only when 4-level (2 bits of) data is stored only in the cell connected to word line WL0. Then, a single NAND cell can store 2 bits+3 bits×42=128 bits, which can be expressed by the nth power of 2. Moreover, since the cell connected to word line WL0 stores 4 levels, not 8 levels, and need not be written to a high threshold level. Therefore, the high program voltage Vpgm is not needed, which can suppress a GIDL problem.

Furthermore, in a memory which stores n levels, only the cell connected to word line WL0 or only a word line whose probability of the occurrence of erroneous writing is high is caused to store k levels (k<n), which can suppress a GIDL problem. Moreover, the cell connected to word line WL31 may be configured similarly.

Figure 35:
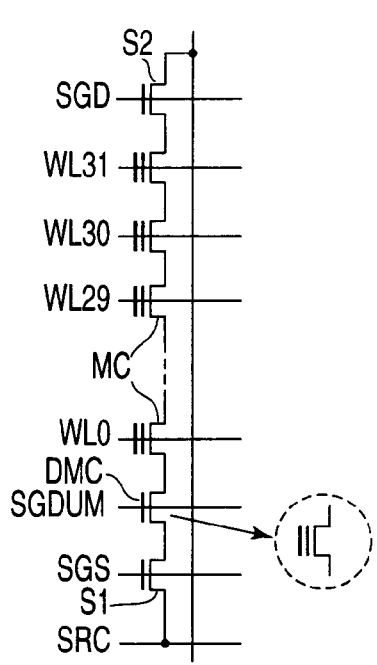
FIG. 35 is a circuit diagram of a fourth embodiment of the invention.

In addition, as shown in FIG. 35, a dummy cell DMC is provided between the memory cell connected to word line WL0 and select gate S1 connected to select line SGS. The dummy cell DMC may have the same configuration as that of the transistor of, for example, the select gate or as that of the memory cell as shown by a broken line. The gate of the dummy cell DMC is connected to a signal line SGDUM. With this configuration, when data is written into the memory cell connected to word line WL0, the signal line SGDUM connected to the dummy cell DMC is set at an intermediate potential (>Vss) and the select line SGS is set at the ground potential Vss. In this configuration, with the program voltage Vpgm being applied to word line WL0, the intermediate potential higher than the ground potential is applied to the gate of the dummy cell DMC. Accordingly, the occurrence of GIDL can be suppressed. In a block other than the selected block in a program operation, the gate potential of the dummy cell DMC is made equal to that of select line SGS.

According to the fourth embodiment, it is possible to prevent the occurrence of GIDL in writing data "1" into word line WL0.

While in the embodiment, the dummy cell has been provided between word line WL0 and select line SGS, the invention is not limited to this.

Figure 36:
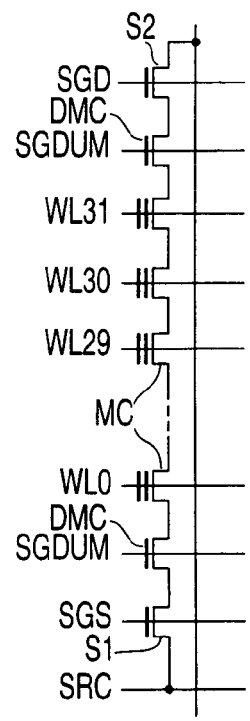
FIG. 36 is a circuit diagram of a modification of the fourth embodiment.

FIG. 36 shows a case where a dummy cell DUM is provide between word line WL31 and select line SGD. As shown in FIG. 36, a dummy cell can be provided so as to be adjacent to each of select lines SGS and SGD. Moreover, in FIG. 36, the dummy cell adjacent to select line SGS may be eliminated and only the dummy cell adjacent to select line SGD may be provided.

While in the fourth embodiment, a dummy cell has been added to prevent word line WL0 or WL31 from being written into erroneously, erroneous writing can be prevented without adding a dummy cell. The distance between word line WL0 and select line SGS and the distance between word line WL31 and select line SGD are made greater than the distance between other word lines.

In addition, for example, in the first modification, the verify levels only for word line WL0 are generally lowered, an increment DVpgm in the program voltage is made finer, each change in the threshold value is made finer, and the threshold distribution width is made narrower. This may lengthen the program time of the cell connected to word line WL0. However, since there is no high verify level for word line WL0, the program voltage Vpgm can be made lower, which enables erroneous writing to be alleviated.

In the second modification, the verify levels for word line WL0 and word line WL1 are generally lowered, an increment DVpgm in the program voltage in writing on word line WL1 is made finer, each change in the threshold value is made finer, and the threshold distribution width is made narrower. In this way, data is written into the cell connected to word line WL1, making smaller the shift of the threshold value of the cell connected to word line WL1, which makes smaller a fluctuation in the threshold level of the cell connected to word line WL0 caused by coupling. Accordingly, the verify levels for word line WL0 are generally lowered, eliminating a high verify level for word line WL0, which makes it possible to lower the program voltage Vpgm and alleviate erroneous writing. Furthermore, the first modification may be combined with the second modification.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array in which a plurality of memory cells are arranged in a matrix, each of said plurality of memory cells storing one of a plurality of threshold levels; and
a control circuit which, when writing one of said plurality of threshold levels into a first memory cell of the memory cell array, writes a threshold level lower than an original threshold level, and which, when not writing a second memory cell adjacent to the first memory cell consecutively, writes the original threshold level into the first memory cell.

2. The semiconductor memory device according to claim 1, wherein the first memory cell, after writing the original threshold level into the first memory cell, does not write the second memory cell in the next writing and writes a third memory cell away from the first memory cell on the second memory cell side.

3. The semiconductor memory device according to claim 1, wherein the second memory cell is kept at a threshold level in erasure.

4. The semiconductor memory device according to claim 1, wherein the control circuit, when reading one of an n number of threshold levels, 1, 2, . . . , n, stored in the memory cell, precharges a specific voltage in the drain of the memory cell and changes the gate voltage of the memory cell to read threshold levels k, k+h, . . . , J−h, J (k, h, i, and n are natural numbers, where $0 \leq k \leq n$, $0 \leq J \leq n$, k<J, h<n).

5. The semiconductor memory device according to claim 4, wherein the control circuit, when the threshold level of the memory cell has reached i in the write sequence, omits the verify operations at threshold level i−m (i<n, m is an integer) and below.

6. The semiconductor memory device according to claim 1, wherein the control circuit, when verifying a write sequence in which one of an n number of threshold levels, 1, 2, . . . , n, is stored into the memory cell, precharges a specific voltage in the drain of the memory cell and changes the gate voltage of the memory cell to read threshold levels k, k+h, . . . , J−h, J (k, h, i, and n are natural numbers, where $0 \leq k \leq n$, $0 \leq J \leq n$, k<J, h<n).

7. The semiconductor memory device according to claim 6, wherein the control circuit, when the threshold level of the memory cell has reached i in the write sequence, omits the verify operations at threshold level i−m (i<n, m is an integer) and below.

8. The semiconductor memory device according to claim 1, wherein the control circuit, when verifying a write sequence in which one of an n number of threshold levels is stored into the memory cell, precharges a specific voltage in the drain of the memory cell and changes the gate voltage of the memory cell to read threshold levels 1, . . . , k (k+h≦n, k and h are natural numbers) and, when level i has been reached, omits the verify operations at level i−1 and below.

9. The semiconductor memory device according to claim 1, wherein the control circuit, when verifying a write sequence in which one of an n number of threshold levels, 1, 2, . . . , n, stored in the memory cell is read, precharges a specific voltage in the drain of the memory cell, supplies a verify voltage lower than an original verify voltage to the gate of the memory cell to read threshold levels from the memory cell sequentially, and then precharges a specific voltage in the drain of the memory cell, and supplies the original verify voltage to the gate of the memory cell to read threshold levels from the memory cell sequentially.

10. The semiconductor memory device according to claim 1, wherein the control circuit, in a write verify operation of storing one of an n number of threshold levels into the memory cell, precharges a specific voltage in the drain of the memory cell, changes the gate voltage of the memory cell to read even-numbered threshold levels consecutively and then precharges a specific voltage in the drain of the memory cell to read odd-numbered threshold levels consecutively.

11. The semiconductor memory device according to claim 1, wherein the control circuit, when verifying a write sequence in which one of an n number of threshold levels, 1, 2, . . . , n, stored in the memory cell is read, precharges a specific voltage in the drain of the memory cell, supplies a verify voltage lower than an original verify voltage to the gate of the memory cell to read even-numbered threshold levels from the memory cell, and then precharges a specific voltage in the drain of the memory cell, supplies the original verify voltage to the gate of the memory cell to read even-numbered threshold levels consecutively from the memory cell, and then precharges a specific voltage in the drain of the memory cell, supplies a verify voltage lower than the original verify voltage to the gate of the memory cell to read odd-numbered threshold levels from the memory cell consecutively, and then precharges a specific voltage in the drain of the memory cell, supplies the original verify voltage to the gate of the memory cell to read odd-numbered threshold levels from the memory cell consecutively.

12. The semiconductor memory device according to claim 1, wherein the second memory cell is adjacent to the first memory cell in the direction of either the word line or the bit line.

13. The semiconductor memory device according to claim 1, wherein the second memory cell is adjacent to the first memory cell in one of the direction of the word line and the direction of the bit line.

14. A semiconductor memory device comprising:
a memory cell array in which a plurality of memory cells are arranged in a matrix, each of said plurality of memory cells storing one of a plurality of threshold levels; and
a control circuit which, when writing one of said plurality of threshold levels into a first memory cell of the memory cell array and further writing a second memory cell adjacent to the first memory cell consecutively, writes a threshold level lower than an original threshold level and which, when not writing the second memory cell adjacent to the first memory cell consecutively, writes the first memory cell at a decreased write speed.

15. The semiconductor memory device according to claim 14, wherein the control circuit decreases the write speed when receiving a specific command.

16. A semiconductor memory device comprising:
a memory cell array in which a plurality of memory cells are arranged in a matrix, each of said plurality of memory cells storing one of a plurality of threshold levels; and
a control circuit which, when writing one of said plurality of threshold levels into a first memory cell of the memory cell array, writes a threshold level lower than an original threshold level and which, when not writing a second memory cell adjacent to the first memory cell consecutively, keeps the first memory cell at the lower threshold level and, when writing one of said plurality of threshold levels into the second memory cell, reads the threshold level from the first memory cell and, after writing a specific threshold level into the second memory cell, writes the original threshold level into the first memory cell on the basis of the result of the reading.

17. The semiconductor memory device according to claim 16, wherein the control circuit, when writing the second memory cell adjacent to the first memory cell consecutively, writes a threshold level lower than the original level into the second memory cell and then writes the original threshold level into the first memory cell.

18. The semiconductor memory device according to claim 16, further comprising a data storage circuit which stores the data read from the first memory cell.

* * * * *